United States Patent
Lee

(10) Patent No.: US 10,020,469 B2
(45) Date of Patent: Jul. 10, 2018

(54) ORGANIC LIGHT-EMITTING APPARATUS

(71) Applicant: SAMSUNG DISPLAY CO., LTD., Yongin, Gyeonggi-Do (KR)

(72) Inventor: Hyunshik Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 338 days.

(21) Appl. No.: 14/730,345

(22) Filed: Jun. 4, 2015

(65) Prior Publication Data

US 2016/0141553 A1   May 19, 2016

(30) Foreign Application Priority Data

Nov. 19, 2014   (KR) .......... 10-2014-0161627

(51) Int. Cl.
*H01L 51/52* (2006.01)

(52) U.S. Cl.
CPC ...... *H01L 51/5281* (2013.01); *H01L 51/5262* (2013.01); *H01L 2251/5338* (2013.01)

(58) Field of Classification Search
CPC ............ H01L 51/5256; H01L 51/5262; H01L 51/5281; H01L 51/5293; H01L 51/0059; H01L 51/0067; H01L 51/007; H01L 51/0072; H01L 51/0093; H01L 2051/0063; H01L 2251/5338; H01L 2251/301; H01L 2251/303; H01L 51/5226; G02B 5/3041; G02B 5/305; G02B 5/3083; G02B 5/3025

USPC .............. 428/690; 257/40, 98–100, E51.02, 257/E51.028, E51.018, E33.055, E33.059, 257/E27.119

See application file for complete search history.

(56) References Cited

U.S. PATENT DOCUMENTS

| | | |
|---|---|---|
| 2004/0095532 A1 | 5/2004 | Parri et al. |
| 2004/0251823 A1 | 12/2004 | Park et al. |
| 2013/0032830 A1 | 2/2013 | Lee et al. |
| 2013/0069090 A1 | 3/2013 | Sawabe et al. |
| 2014/0319508 A1* | 10/2014 | Tanihara .............. G02B 5/3025 257/40 |

FOREIGN PATENT DOCUMENTS

| | | |
|---|---|---|
| KR | 10-2004-0102651 | 12/2004 |
| KR | 10-2011-0054765 A | 5/2011 |
| KR | 10-2013-0016042 | 2/2013 |
| KR | 10-2013-0030187 | 3/2013 |

OTHER PUBLICATIONS

Daisuke Yokoyama, Molecular orientation in small-molecule organic light-emitting diodes, Journal of Materials Chemistry, 2011, 21, 19187.

* cited by examiner

*Primary Examiner* — Ruiyun Zhang
(74) *Attorney, Agent, or Firm* — Lee & Morse, P.C.

(57) ABSTRACT

An organic light-emitting apparatus includes a flexible substrate, an organic light-emitting device on the flexible substrate, the light emitting device including a first electrode, an emission layer, and a second electrode sequentially disposed on the flexible substrate, and an anisotropic film on the second electrode of the organic light-emitting device. The anisotropic film includes an anisotropic material horizontally oriented with respect to a surface of the flexible substrate.

18 Claims, 12 Drawing Sheets

ORGANIC LIGHT-EMITTING APPARATUS

CROSS-REFERENCE TO RELATED APPLICATION

Korean Patent Application No. 10-2014-0161627, filed on Nov. 19, 2014, in the Korean Intellectual Property Office, and entitled: "Organic Light-Emitting Apparatus," is incorporated by reference herein in its entirety.

BACKGROUND

1. Field

Exemplary embodiments relate to an organic light-emitting apparatus.

2. Description of the Related Art

Organic light-emitting devices are self-emission devices that have wide viewing angles, high contrast ratios, short response times, and excellent brightness, driving voltage, and response speed characteristics, and produce full-color images.

The organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

Embodiments are directed to an organic light-emitting apparatus including a flexible substrate, an organic light-emitting device in which a first electrode, an emission layer, and a second electrode are sequentially stacked on the flexible substrate, and an anisotropic film on the second electrode of the organic light-emitting device.

The anisotropic film may include an anisotropic material horizontally oriented with respect to a surface of the flexible substrate.

An orientation order parameter of the anisotropic material may be about −0.5 to about −0.2.

The anisotropic material may include a compound represented by at least one of Formulae 1 to 3 below:

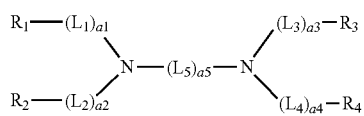

<Formula 1>

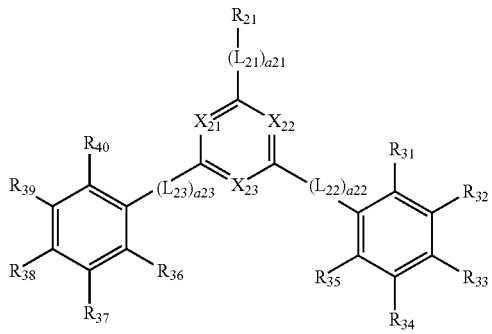

<Formula 2>

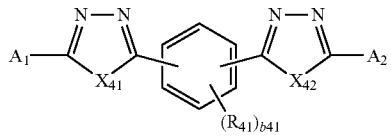

<Formula 3>

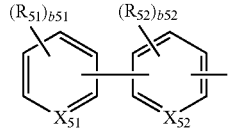

<Formula 4>

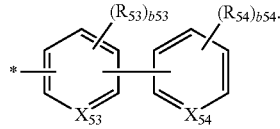

<Formula 5>

In Formulae 1 to 3, $L_1$ to $L_5$ and $L_{21}$ to $L_{23}$ may be each independently selected from a substituted or unsubstituted $C_2$-$C_{10}$ alkenylene group, a substituted or unsubstituted $C_3$-$C_{10}$ cycloalkylene group, a substituted or unsubstituted heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group and a substituted or unsubstituted divalent non-aromatic condensed heteropolycyclic group;

a1 to a4 may be each independently selected from 0, 1, 2, and 3, when a1 is 2 or higher, two or more $L_1$ may be identical to or different from each other, when a2 is two or higher, two or more $L_2$ may be identical to or different from each other, when a3 is 2 or higher, two or more $L_3$ may be identical to or different from each other, when a4 is 2 or higher two or more $L_4$ may be identical to or different from each other;

a1+a2+a3+a4 may be 1 or higher;

a5 may be selected from 2, 3, 4, 5, 6, and 7; when a5 is 2 or higher, two or more $L_5$ may be identical to or different from each other;

a21 to a23 may be each independently selected from 0, 1, and 2; when a21 is 2 or higher, two or more $L_{21}$ may be identical to or different from each other; when a22 is 2 or higher, two or more $L_{22}$ may be identical to or different from each other; and when a23 is 2 or higher, two or more $L_{23}$ may be identical to or different from each other;

$X_{21}$ may be N or $C(R_{61})$, $X_{22}$ may be N or $C(R_{62})$, $X_{23}$ may be N or $C(R_{63})$;

$X_{41}$ and $X_{42}$ may be each independently O or S;

$A_1$ may be represented by Formula 4, $A_2$ may be represented by Formula 5;

$X_{51}$ may be $C(R_{71})$ or N, $X_{52}$ may be $C(R_{72})$ or N, $X_{53}$ may be $C(R_{73})$ or N, $X_{54}$ may be $C(R_{74})$ or N, at least one of $X_{51}$ and $X_{52}$ may be N, and at least one of $X_{53}$ and $X_{54}$ may be N;

$R_1$ to $R_4$ and $R_{31}$ to $R_{40}$ may be each independently selected from a hydrogen, $N(R_{11})(R_{12})$, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, and $R_1$ and $R_2$, and $R_3$ and $R_4$ are each independently ring-forming substituents that may be connected to each other to form a ring;

$R_{11}$, $R_{12}$, $R_{21}$, $R_{41}$, $R_{51}$ to $R_{54}$, $R_{61}$ to $R_{63}$ and $R_{71}$ to $R_{73}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_4$)($Q_5$) and N($Q_6$)($Q_7$).

b41 may be selected from 0, 1, 2, 3, and 4 and when b41 is 2 or higher, two or more $R_{41}$ may be identical to or different from each other;

b51 and b54 may be each independently selected from 0, 1, 2, 3, and 4, and when b51 is 2 or higher, two or more $R_{51}$ may be identical to or different from each other, but they may connect to form a ring, and when b52 is 2 or higher, two or more $R_{52}$ may be identical to or different from each other and they may connect to each other to form a ring;

b52 and b53 may be each independently selected from 0, 1, 2, and 3, when b52 is 2 or higher, two or more $R_{52}$ may be identical to or different from each other and they may connect to each other to form a ring, when b53 is 2 or higher two or more $R_{53}$ may be identical to or different from each other and they may connect to each other to form a ring;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group, may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —B($Q_{14}$)($Q_{15}$), and —N($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —B($Q_{24}$)($Q_{25}$) and —N($Q_{26}$)($Q_{27}$); and —Si($Q_{31}$)($Q_{32}$)($Q_{33}$), —B($Q_{34}$)($Q_{35}$) and —N($Q_{36}$)($Q_{37}$);

wherein $Q_{11}$ to $Q_{17}$, $Q_{21}$ to $Q_{27}$ and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

The organic light-emitting apparatus may further include an encapsulating layer encapsulating the organic light-emitting device and an optical layer disposed on the encapsulating layer. The anisotropic film may be disposed on at least one of the encapsulating layer, optical layer, and a location between the organic light-emitting device and the encapsulating layer.

For example, the encapsulating layer includes an n number of encapsulating units in which an organic film and an inorganic film are sequentially stacked on a second electrode of the organic light-emitting device, wherein the n is an integer of 1 or greater. At least one of the organic films among the n encapsulating units may be the anisotropic film.

The optical layer may include a phase delay layer and a polarizing layer. The phase delay layer may include the anisotropic film.

At least one of a capping layer and a protective layer may be disposed between the organic light-emitting device and the encapsulating layer. At least one of the capping layer and the protective layer may include the anisotropic film.

A difference of visiblity regarding black color between the front view and the side view ($\Delta_{60°\text{-}10°}$) of the organic light-emitting apparatus represented by Equation 2 may be 0.05 or lower:

Difference of visiblity regarding black color between the front view and the side view ($\Delta_{60°\text{-}10°}$)
=value of visiblity regarding black color at an altitude angle of 60° (visibility regarding black color of the side view)−value of visiblity regarding black color at an altitude angle of 10° (visibility regarding black color of the front view). <Equation 2>

Embodiments are also directed to an organic light-emitting apparatus including a flexible substrate, an organic light-emitting device including a first electrode, an emission layer, and a second electrode sequentially disposed on the flexible substrate, and an encapsulating layer covering the organic light-emitting device. The encapsulating layer has a structure in which a first organic film, a first inorganic film, a second organic film, and a second inorganic film are sequentially stacked on the organic light-emitting device. The first organic film and the second organic film may be identical to or different from each other. At least one of the first organic film and the second organic film may be an anisotropic film, which includes an anisotropic material horizontally oriented with respect to a surface of the substrate.

Embodiments are also directed to an organic light-emitting device including a flexible substrate, a first electrode, an emission layer, and a second electrode sequentially disposed on the flexible substrate, an encapsulating layer encapsulating the organic light-emitting device, and an optical layer disposed on the encapsulating layer. The optical layer includes a phase delay layer including a phase delay plate and a polarizing layer. An anisotropic film is between the encapsulating layer and the phase delay layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
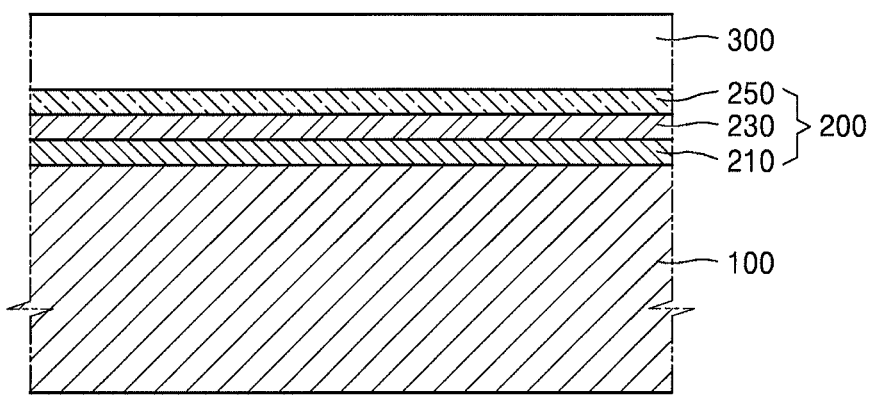
FIG. 1 illustrates a schematic view of an organic light-emitting apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

An organic light-emitting apparatus 10 as illustrated in FIG. 1 may include a flexible substrate 100, an organic light-emitting device 200 disposed on the flexible substrate 100, and an anisotropic film 30 disposed on the organic light-emitting device 200.

The flexible substrate 100 may be formed of a suitable flexible material. For example, the flexible substrate 100 may be formed of a material having excellent mechanical strength, thermal stability, transparency, surface smoothness, ease of handling, and water-proofness. As examples, the material forming the flexible substrate 100 may be selected from a carbonaceous material, a metal foil, thin glass, and plastic. The plastic substrate may be formed of an insulating organic material. The insulating organic material may be, for example, selected from of polyethersulfone (PES), polyacrylate (PAR), polyetherimide (PEI), polyethylene naphthalate (PEN), polyethyllene terephthalate (PET), polyphenylene sulfide (PPS), polyallylate, polyimide, polycarbonate (PC), cellulose triacetate (TAC), or cellulose acetate propionate (CAP).

When the organic light-emitting apparatus is a bottom emission type displaying an image in a direction of the flexible substrate 100, the flexible substrate 100 may be transparent. When the organic light-emitting apparatus is a top emission type displaying an image in an opposite direction from the flexible substrate 100, the flexible substrate 100 does not need to be transparent. In this case, the flexible substrate 100 may be a metal substrate. The metal of the metal substrate may be, for example, selected from iron, chromium, manganese, nickel, titanium, molybdenum, and stainless steel (SUS).

On the flexible substrate 100, the organic light-emitting device 200 including a first electrode 210, an organic layer 230, and a second electrode 250 sequentially stacked on the flexible substrate 100 may be disposed.

The first electrode 210 may be formed by, for example, depositing or sputtering a material for a first electrode on the substrate 100. When the first electrode 210 is an anode, the material for the first electrode may be selected from materials with a high work function to make holes be easily injected. The first electrode 210 may be a reflective electrode or a transmissive electrode. The material for the first electrode may be a transparent and highly conductive material. Examples of such a material include indium tin oxide (ITO), indium zinc oxide (IZO), tin oxide ($SnO_2$), and zinc oxide (ZnO). In some embodiments, when magnesium (Mg), aluminum (Al), aluminum-lithium (Al—Li), calcium (Ca), magnesium-indium (Mg—In), or magnesium-silver (Mg—Ag) is used, the first electrode 210 may be formed as a reflective electrode.

The first electrode 210 may have a single-layer structure, or a multi-layer structure including two or more layers. For example, the first electrode 210 may have a three-layered structure of ITO/Ag/ITO.

An emission layer 230 may be disposed on the first electrode 210.

The organic light-emitting device 200 may further include a hole transport region disposed between the first electrode 210 and the emission layer 230 and an electron transport region disposed between the emission layer 230 and the second electrode 250.

The hole transport region may include at least one selected from a hole injection layer (HIL), a hole transport layer (HTL), a buffer layer, and an electron blocking layer (EBL). The electron transport region may include at least one selected from a hole blocking layer (HBL), an electron transport layer (ETL), and an electron injection layer (EIL).

The HIL may be formed on the first electrode by a suitable method, such as vacuum deposition, spin coating casting, a Langmuir-Blodgett (LB) method, ink-jet printing, laser-printing, or laser-induced thermal imaging (LITI).

When a HIL is formed by vacuum deposition, for example, the vacuum deposition may be performed at a temperature of a deposition temperature of about 100 to about 500° C., at a vacuum degree of about $10^{-8}$ to about $10^{-3}$ torr, and at a deposition rate of about 0.01 to about 100 Å/sec in consideration of a compound for a hole injection layer to be deposited, and the structure of a hole injection layer to be formed.

When HIL is formed by spin coating, the spin coating may be performed at a coating rate of about 2,000 rpm to about 5,000 rpm, and at a temperature of about 80° C. to 200° C. in consideration of a compound for a HIL to be deposited, and the structure of a HIL to be formed.

When the hole transport region includes a HTL, the HTL may be formed on the first electrode or the HIL by a suitable method, such as vacuum deposition, spin coating, casting, a LB method, ink-jet printing, laser-printing, or laser-induced thermal imaging. When the HTL is formed by vacuum deposition or spin coating, deposition and coating conditions for the HTL may be the same as the deposition and coating conditions for the HIL.

The emission layer 230 may include a host and a dopant. The emission layer 230 may be formed on the HTL by referring to the vacuum conditions and coating conditions of the HIL.

A thickness of the emission layer 230 may be about 100 Å to about 1,000 Å, or, for example, about 200 Å to about 600 Å. When the thickness of the emission layer 230 is within this range, excellent light-emission characteristics may be obtained without a substantial increase in driving voltage.

An electron transport region may be formed on the emission layer 230 by referring to the vacuum conditions and coating conditions of the HIL. The electron transport region may include an ETL and an EIL.

A thickness of the ETL may be in a range of about 100 Å to about 1,000 Å, or, for example, about 150 Å to about 500 Å. When the thickness of the ETL is within the range described above, the ETL may have satisfactory electron transport characteristics without a substantial increase in driving voltage.

A thickness of the EIL may be in a range of about 1 Å to about 100 Å, for example, about 3 Å to about 90 Å. When the thickness of the EIL is within the range described above, the EIL may have satisfactory electron injection characteristics without a substantial increase in driving voltage.

An anisotropic film 300 may be disposed on the second electrode 250 of the organic light-emitting device 200.

Figure 2:
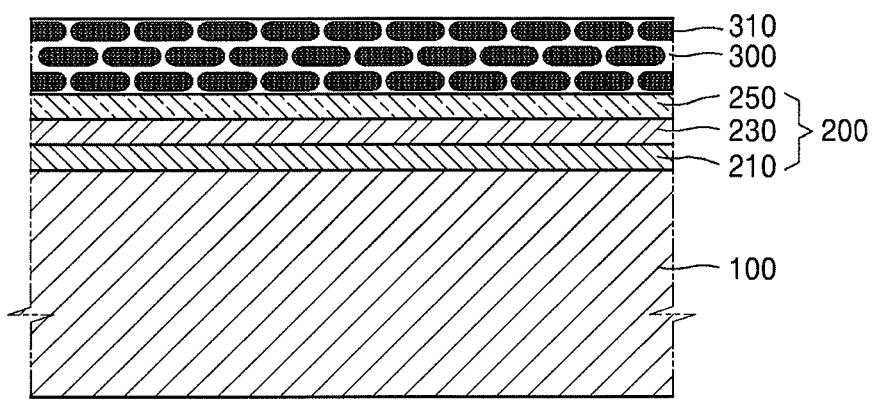
FIG. 2 illustrates a side view of an organic light-emitting apparatus according to an embodiment, including an anisotropic material horizontally oriented with respect to a surface of the flexible substrate.
Figure 3:
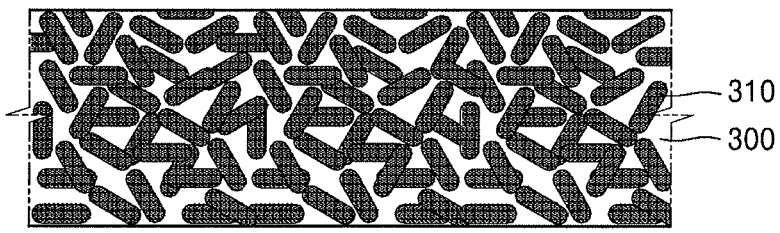
FIG. 3 illustrates a plan view of an organic light-emitting apparatus according to an embodiment, including an anisotropic material horizontally oriented with respect to a surface of the flexible substrate.

FIG. 2 illustrates a side view of an organic light-emitting apparatus according to an embodiment including an anisotropic material horizontally oriented with respect to a surface of the flexible substrate, and FIG. 3 illustrates a plan view of an organic light-emitting apparatus according to an embodiment including an anisotropic material horizontally oriented with respect to a surface of the flexible substrate.

Referring to FIG. 2, the anisotropic film 300 may include an anisotropic material 310 horizontally oriented with respect to a surface of the flexible substrate 100. A major axis of the anisotropic material 310 may be parallel to a surface of the flexible substrate 100, but an optical axis may be perpendicular to the surface of the flexible substrate 100.

As shown in FIG. 2, the anisotropic material 310 may be stacked parallel to the flexible substrate 100, or, as shown in FIG. 3, may be randomly oriented within a flat surface including the anisotropic material.

In this regard, a film including materials that are not regularly oriented is generally isotropic; however, the anisotropic film 300 according to an embodiment, is anisotropic due to the anisotropic material 310.

According to embodiments, a vertical refractive index with respect to the flexible substrate 100 in which the anisotropic material 310 is parallelly stacked, is different from a horizontal refractive index with respect to the flexible substrate 100 in which the anisotropic material 310 is randomly oriented. An optical path of light that progresses to the front and the side of the organic light-emitting apparatus 10 may be compensated. A side reflectance in addition to a front reflectance may be reduced to improve front and side visibilities of the organic light-emitting apparatus 10.

Generally, an orientation of a material may be represented by an orientation order parameter (S) of Equation 1 below:

$$S = \frac{1}{2}(3\cos^2\theta - 1) = \frac{k_e - k_o}{k_e + 2k_o} \qquad \text{<Equation 1>}$$

In Equation 1 above, $\theta$ is an angle between a major axis and a vertical direction of a material with respect to a surface of a substrate, $k_o$ is an ordinary extinction coefficient of a parallel direction of a material with respect to a surface of the substrate, $k_e$ is an extraordinary extinction coefficient of a parallel direction of a material with respect to a surface of the substrate. The $k_o$ and $k_e$ may be measured by using variable angle spectroscopic ellipsometry (VASE).

When a material is horizontally oriented with respect to a surface of a substrate, a value of S is −0.5 and when the material is vertically oriented with respect to a surface of the substrate, the value of S may be 1. When the material is randomly oriented, the value of S may be 0.

According to an embodiment, an orientation order parameter of the anisotropic material 310 may be −0.5 to −0.2, or, for example, −0.5 to −0.4. In the ranges described above, the anisotropic material 310 may be horizontally oriented with respect to a surface of the flexible substrate 100, considering electron mobility and triplet diffusion length of the material. Accordingly, in the ranges described above, a side visibility of the organic light-emitting apparatus 10 including the anisotropic film 300, which includes the anisotropic material 310, may be improved effectively.

According to an embodiment, the anisotropic material 310 may include a compound represented by at least one of Formulae 1 to 3:

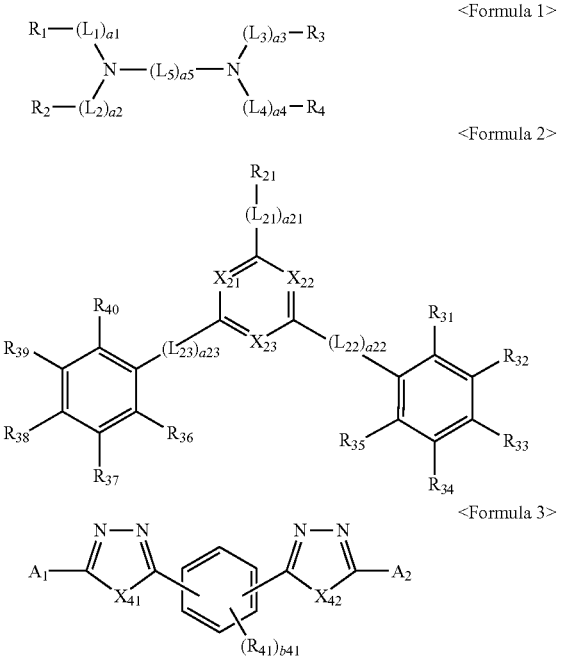

<Formula 1>
<Formula 2>
<Formula 3>

In Formulae 1 to 3, $L_1$ to $L_5$ and $L_{21}$ to $L_{23}$ may be each independently selected from a substituted or unsubstituted $C_2$-$C_{10}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a4 may be each independently selected from 0, 1, 2, and 3; when a1 is 2 or higher, two or more $L_1$ may be identical to or different from each other, when a2 is 2 or higher, two or more $L_2$ may be identical to or different from each other, when a3 is 2 or higher, two or more $L_3$ may be identical to or different from each other, and when a4 is 2 or higher, two or more $L_4$ may be identical to or different from each other;

a1+a2+a3+a4 may be 1 or higher;

a5 may be selected from 2, 3, 4, 5, 6, and 7 and when a5 is 2 or higher, two or more $L_5$ may be identical to or different from each other;

a21 to a23 may be each independently selected from 0, 1, and 2, when a21 is 2 or higher, two or more $L_{21}$ may be identical to or different from each other, when a22 is 2 or higher, two or more $L_{22}$ may be identical to or different from each other, and when a23 is 2 or higher, two or more $L_{23}$ may be identical to or different from each other.

According to an embodiment, $L_1$ to $L_5$ and $L_{21}$ to $L_{23}$ may be each independently selected from an ethenylene group, a butenylene group, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenyl group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and an ethenylene group, a butenylene group, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group and an imidazopyrimidinyl group.

In some embodiments, regarding Formulae 1 and 2, $L_1$ to $L_5$ and $L_{21}$ to $L_{23}$ may be each independently represented by one of Formulae 5-1 to 5-16 below;

wherein a1 to a4 may be each independently selected from 0, 1, and 2, a5 may be selected from 2, 3, 4, 5, and 6, a21 may be 0, and a22 and a23 may be each independently 0 or 1.

Formula 5-1

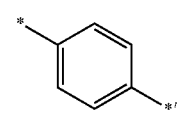

Formula 5-2

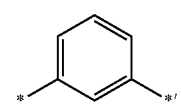

Formula 5-3

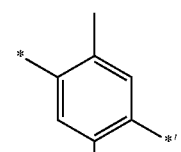

Formula 5-4

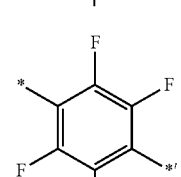

Formula 5-5

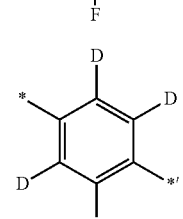

Formula 5-6

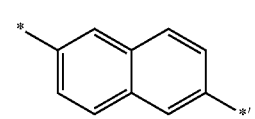

Formula 5-7

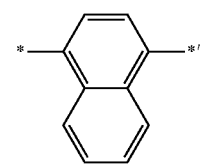

Formula 5-8

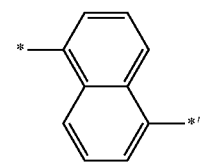

Formula 5-9

-continued

Formula 5-10

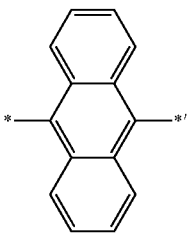

Formula 5-11

Formula 5-12

Formula 5-13

Formula 5-14

Formula 5-15

Formula 5-16

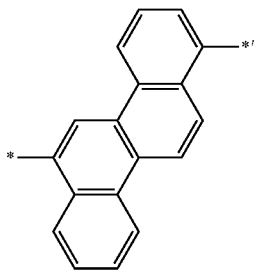

* and *' in Formulae 5-1 to 5-16 each indicate a binding site to a neighboring atom.

* and *' in Formulae 5-1 to 5-16 each indicate a binding site to a neighboring atom.

For example, $L_1$ to $L_4$ may be represented by Formula 5-2 above, a sum of a1 to a4 may be 4, $L_5$ may be represented by Formula 5-1 or 5-2, and a5 may be selected from 2, 3, 4, 5, and 6.

In Formulae 1 to 3, $X_{21}$ may be N or $C(R_{61})$, $X_{22}$ may be N or $C(R_{62})$, and $X_{23}$ may be N or $C(R_{63})$; and $X_{41}$ and $X_{42}$ may be each independently O or S.

For example, $X_{21}$ may be N, $X_{22}$ may be N, $X_{23}$ may be $C(R_{63})$; and $X_{41}$ and $X_{42}$ may be O.

In Formulae 1 to 3, $R_1$ to $R_4$ and $R_{31}$ to $R_{40}$ may be each independently selected from a hydrogen, $N(R_{11})(R_{12})$, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and each of $R_1$, $R_2$, $R_3$, and $R_4$ may be a ring-forming substituent that may be connected to each other to form a ring.

According to an embodiment, $R_1$ to $R_4$ and $R_{31}$ to $R_{40}$ may be each independently selected from a hydrogen, $N(R_{11})$$(R_{12})$, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, and a dibenzocarbazolyl group; and $N(R_{11})(R_{12})$, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a benzocarbazolyl group, a dibenzocarbazolyl group, and —Si($Q_{31}$)($Q_{32}$)($Q_{33}$), wherein $Q_{31}$ to $Q_{33}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

According to an embodiment, $R_1$ to $R_4$, and $R_{31}$ to $R_{40}$ may be each independently represented by Formulae 6-1 to 6-15 below:

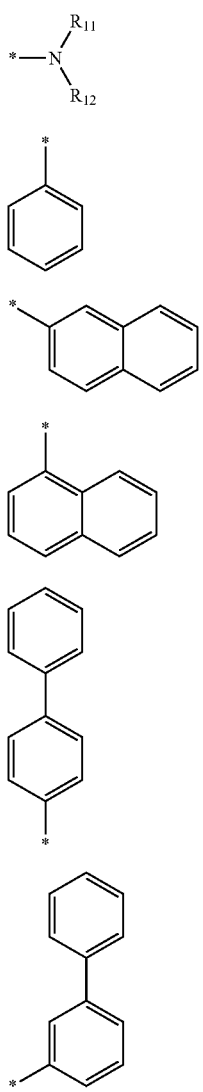

Formula 6-1

Formula 6-2

Formula 6-3

Formula 6-4

Formula 6-5

Formula 6-6

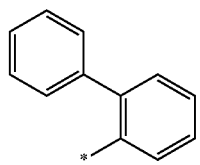

Formula 6-7

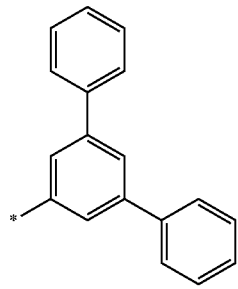

Formula 6-8

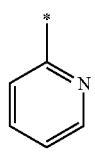

Formula 6-9

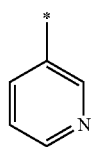

Formula 6-10

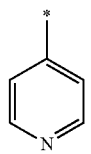

Formula 6-11

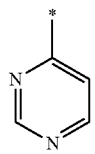

Formula 6-12

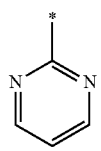

Formula 6-13

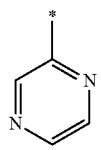

Formula 6-14

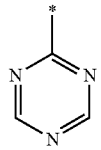

Formula 6-15

*in Formulae 6-1 to 6-15 indicates a binding site to a neighboring atom.

* in Formulae 6-1 to 6-15 indicates a binding site to a neighboring atom.

According to an embodiment, $R_1$ to $R_4$ may be each independently selected from Formulae 6-1 to 6-8 above, and $R_{31}$ to $R_{40}$ may be each independently selected from Formulae 6-9 to 6-15 above.

In Formulae 1 to 3, $R_{11}$, $R_{12}$, $R_{21}$, $R_{41}$, $R_{51}$ to $R_{54}$, $R_{61}$ to $R_{63}$, and $R_{71}$ to $R_{73}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_4$)($Q_5$), and N($Q_6$)($Q_7$), b41 may be selected from 0, 1, 2, 3, and 4, when b41 is 2 or higher, two or more $R_{41}$ may be identical to or different from each other;

b51 and b54 may be each independently selected from 0, 1, 2, 3, and 4, when b51 is 2 or higher, two or more $R_{51}$ may be identical to or different from each other, each of which may be connected to each other to form a ring and when b52 is 2 or higher, two or more $R_{52}$ may be identical to or different from each other, each of which may be connected to each other to form a ring;

b52 and b53 may be each independently selected from 0, 1, 2, and 3; when b52 is 2 or higher, two or more $R_{52}$ may be identical to or different from each other, each of which may be connected to each other to form a ring, and when b53 is 2 or higher, two or more $R_{53}$ may be identical to or different from each other, each of which may be connected to each other to form a ring.

According to an embodiment, $R_{11}$, $R_{12}$, $R_{21}$, $R_{41}$, $R_{51}$ to $R_{54}$, $R_{61}$ to $R_{63}$, and $R_{71}$ to $R_{73}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, and —Si($Q_{31}$)($Q_{32}$)($Q_{33}$); and —Si($Q_1$)($Q_2$)($Q_3$).

According to an embodiment, $R_{11}$, $R_{12}$, $R_{21}$, $R_{41}$ and $R_{63}$ above may be each independently selected from a hydrogen, a methyl group, a phenyl group, or a biphenyl group.

For example, $R_{11}$ and $R_{12}$ above may be each independently selected from a phenyl group or a biphenyl group, $R_{21}$ above may be a methyl group or a phenyl group, and $R_{41}$ and $R_{63}$ above may be a hydrogen.

In Formula 3 above, $A_1$ above may be represented by Formula 4 below, and $A_2$ above may be represented by Formula 5 below, <Formula 4>

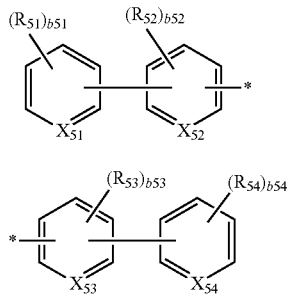

<Formula 5>

In Formulae 4 and 5, $X_{51}$ may be $C(R_{71})$ or N, $X_{52}$ may be $C(R_{72})$ or N, $X_{53}$ may be $C(R_{73})$ or N, $X_{54}$ may be $C(R_{74})$ or N, at least one of $X_{51}$ and $X_{52}$ may be N, and at least one of $X_{53}$ and $X_{54}$ may be N.

At least one of $X_{51}$ and $X_{52}$ may be N, at least one of $X_{53}$ and $X_{54}$ may be N, or all of $X_{51}$, $X_{52}$, $X_{53}$ and $X_{54}$ above may be N.

Accordingly, a compound represented by Formula 3 may include a heteroaryl group containing at least one nitrogen (N). The nitrogen N may form a hydrogen bonding with a hydrogen of a neighboring substituent to be horizontally oriented in a flexible substrate.

For example, $A_1$ and $A_2$ above may be each independently represented by at least one of Formulae 7-1 to 7-16 below. $A_1$ and $A_2$ may have at least two hydrogen bonds or, for example, four hydrogen bonds in the molecules thereof:

Formula 7-1

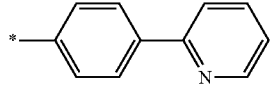

Formula 7-2

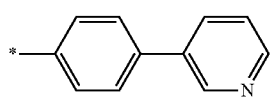

Formula 7-3

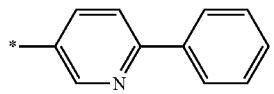

Formula 7-4

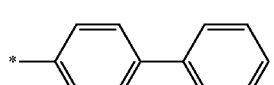

Formula 7-5

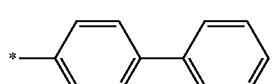

Formula 7-6

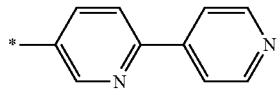

Formula 7-7

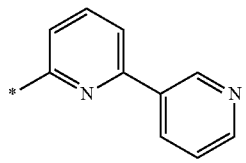

Formula 7-8

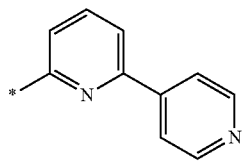

Formula 7-9

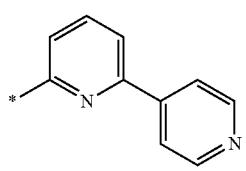

Formula 7-10

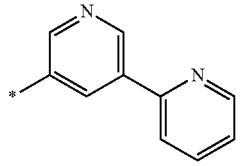

Formula 7-11

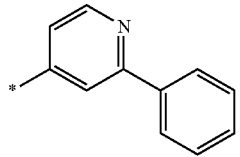

Formula 7-12

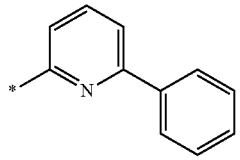

Formula 7-13

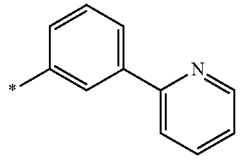

Formula 7-14
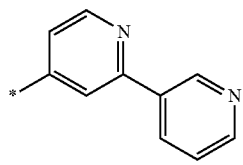
Formula 7-15
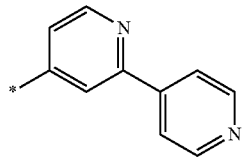
Formula 7-16
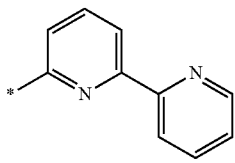
*in Formulae 7-1 to 7-16 indicates a binding site to a neighboring atom.
* in Formulae 7-1 to 7-16 indicates a binding site to a neighboring atom.
According to an embodiment, the anisotropic material 310 may include a compound represented by one of Formulae 1-1 to 1-5, 2-1, 2-2, and 3-1 to 3-4 below:
<Formula 1-1>
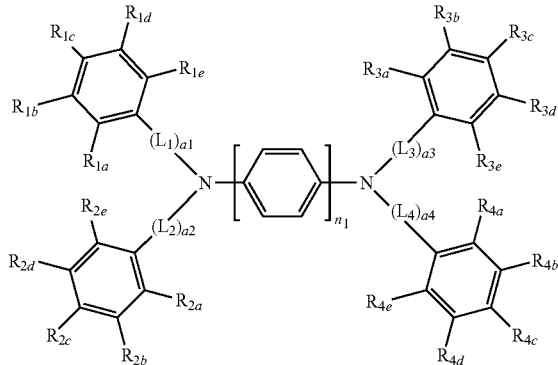
<Formula 1-2>
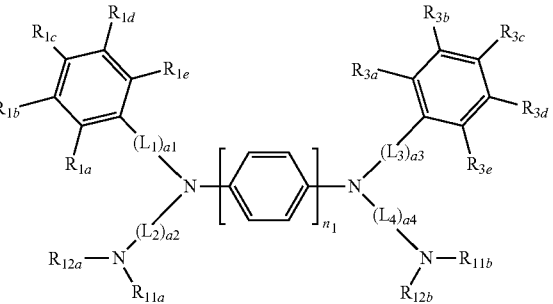
<Formula 1-3>
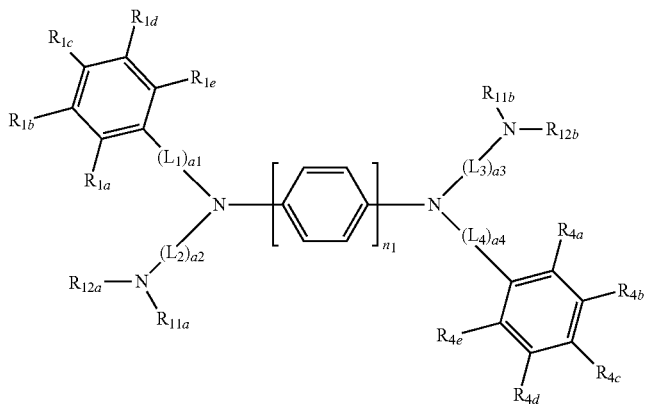
<Formula 1-4>
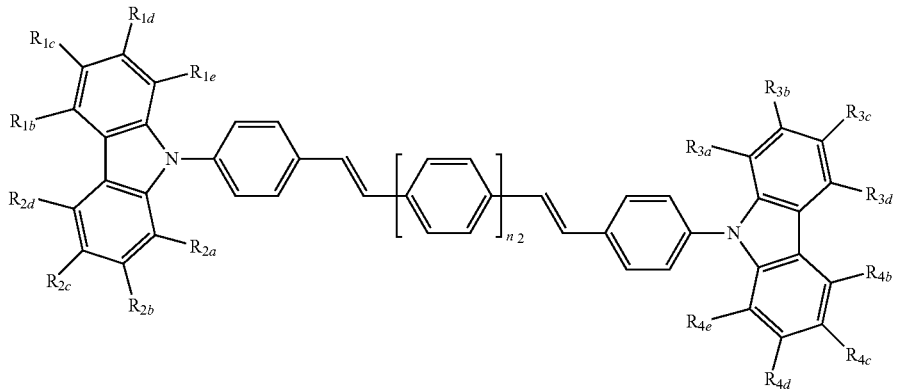

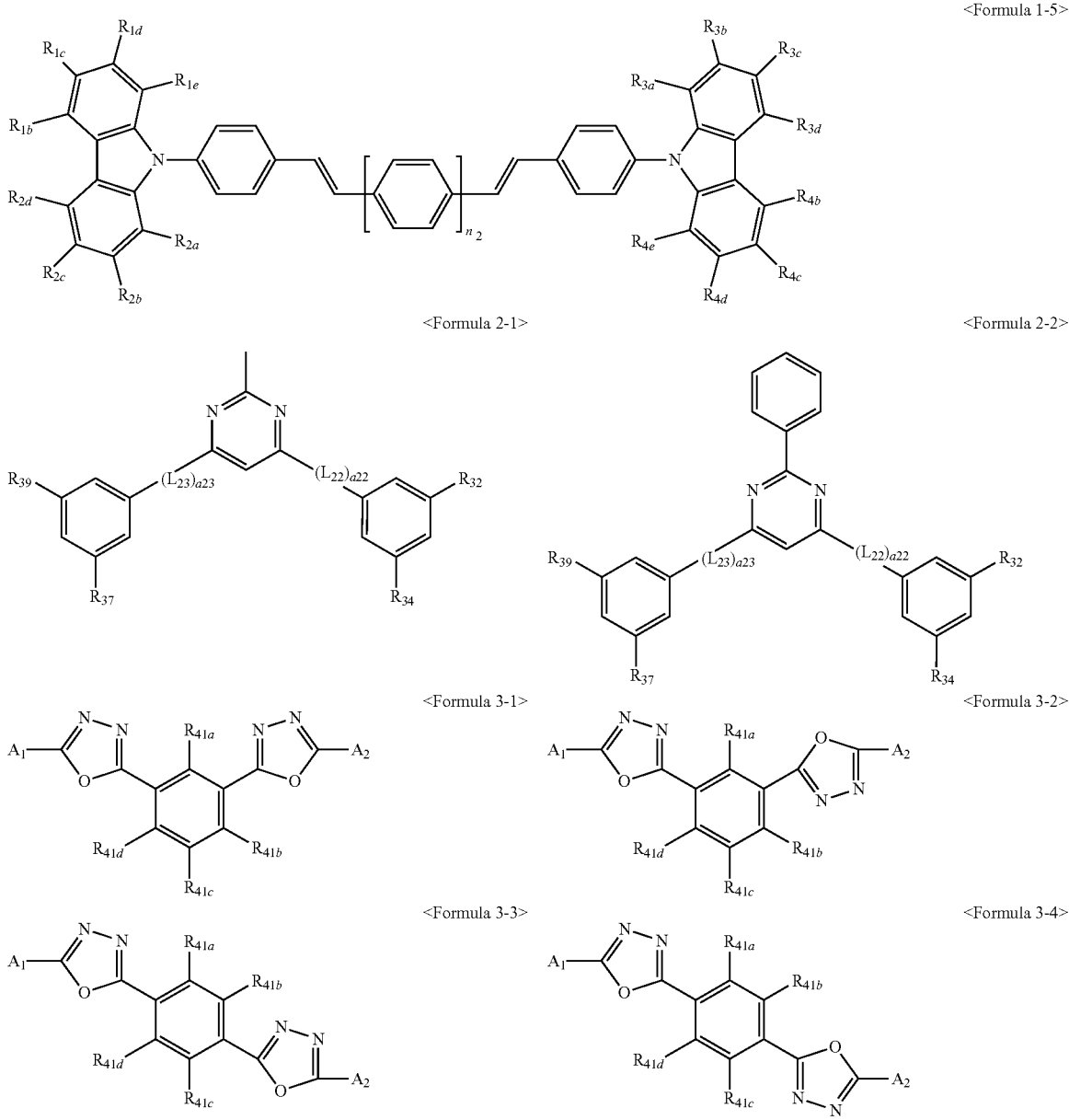

wherein in Formulae 1-1 to 1-5, 2-1 to 2-2, and 3-1 to 3-4 above, $L_1$ to $L_4$, $L_{22}$ and $L_{23}$, a1 to a4, a21 to a23, $R_{32}$, $R_{34}$, $R_{37}$ and $R_{39}$ may be described with reference to the descriptions provided above, n1 may be 2 or 3, n2 may be 1 or 2, each of $R_{1a}$ to $R_{1e}$ may be described with reference to the description of $R_1$, each of $R_{2a}$ to $R_{2c}$ may be described with reference to the description of $R_2$, each of $R_{3a}$ to $R_{3e}$ may be described with reference to the description of $R_3$, and each of $R_{4a}$ to $R_{4e}$ may be described with reference to the description of $R_1$, each of $R_{11a}$ and $R_{11b}$ may be described with reference to the description of $R_{11}$, each of $R_{12a}$ and $R_{12b}$ may be described with reference to the description of $R_{12}$, each of $R_{41a}$ to $R_{41d}$ may be described with reference to the description of $R_{41}$, and A1 and A2 may be represented by one of Formulae 8-1 to 8-3 below,

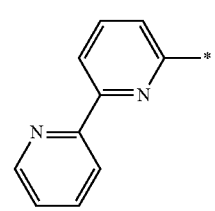

Formula 8-1

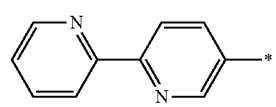

Formula 8-2

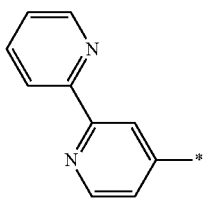

Formula 8-3

\* in Formulae 8-1 to 8-3 indicates a binding site to a neighboring atom.

When the anisotropic material 310 includes a compound represented by one of Formulae 1-1 to 1-5, 2-1, and 2-2 above, a major axis of the anisotropic material 310 may be sufficiently longer than a minor axis such that the anisotropic material 310 is horizontally oriented with respect to a surface of the flexible substrate 100.

When the anisotropic material 310 is represented by one of Formulae 3-1 to 3-4 above, the anisotropic material 310 may be horizontally oriented with respect to a surface of the flexible substrate 100 due to a hydrogen bond within a molecule of the anisotropic material 310.

$A_1$ and $A_2$ in Formulae 3-1 to 3-4 above may have hydrogen bonds as illustrated in Formulae 8-1 to 8-3 below. Thus, $A_1$ and $A_2$ may contribute to a horizontal orientation with respect to the flexible substrate 100 of the anisotropic material.

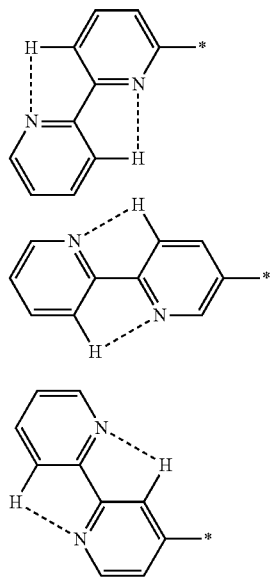

Formula 8-1

Formula 8-2

Formula 8-3

According to an embodiment, the anisotropic material 310 may include a compound represented by any one of Compounds 1 to 12 below:

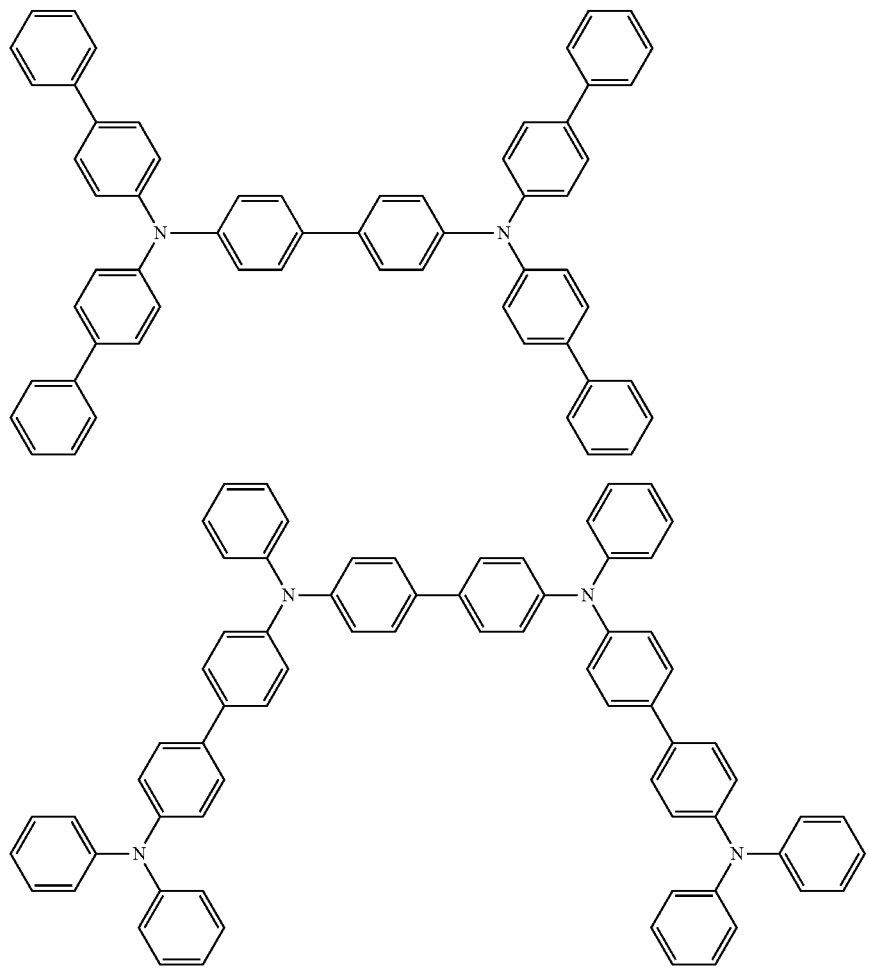

1

2

-continued
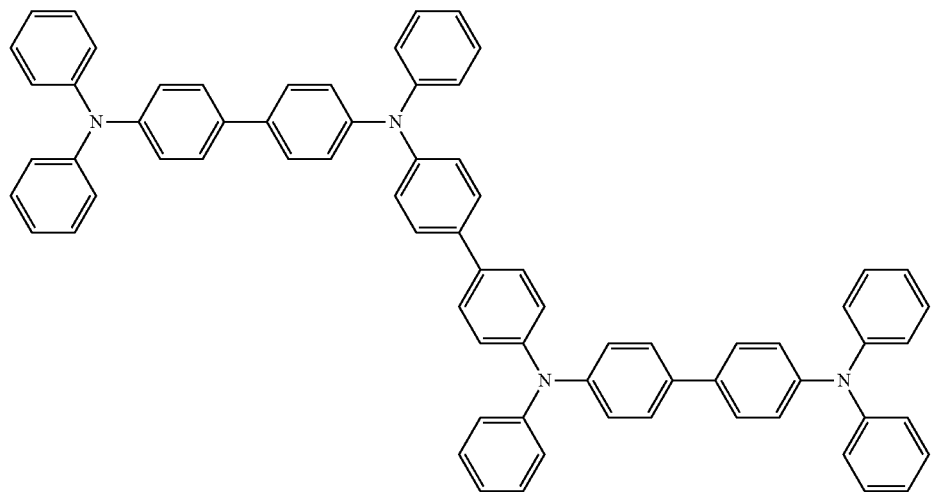
3
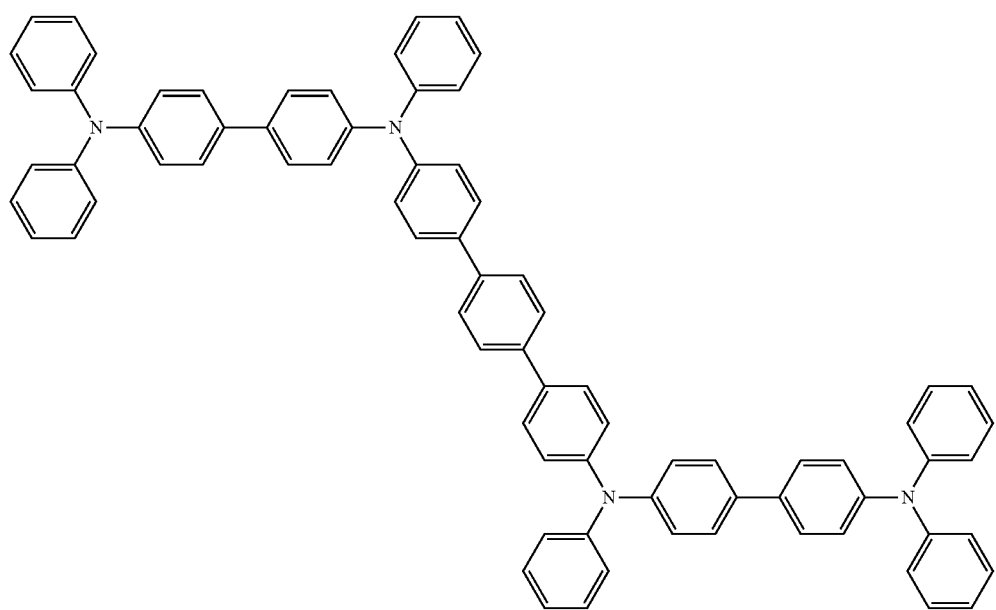
4

5
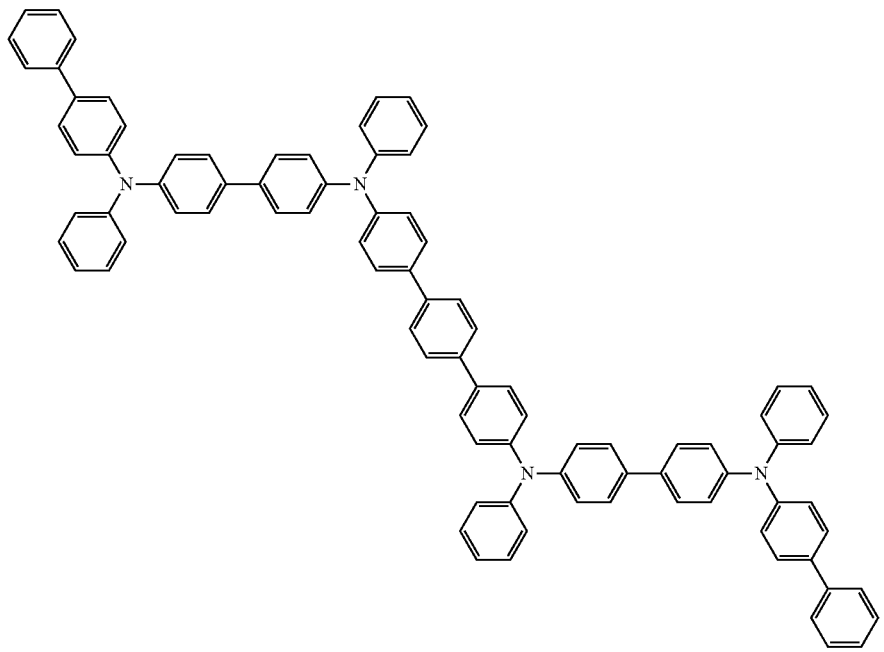
6
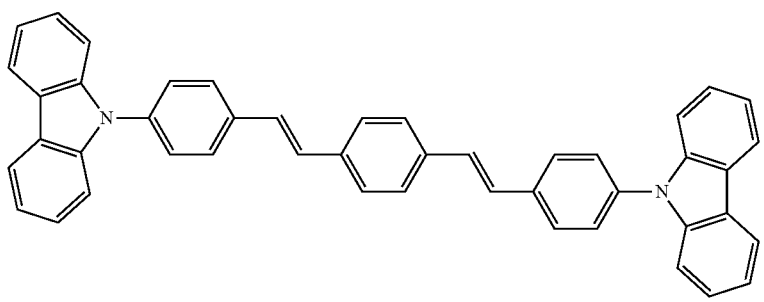
7
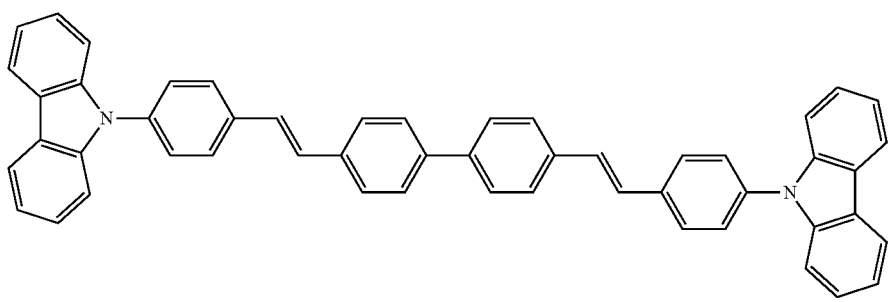

-continued

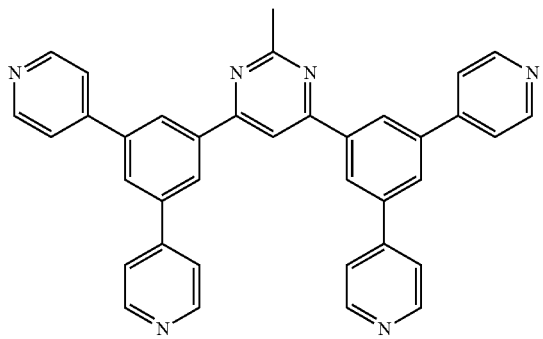

8

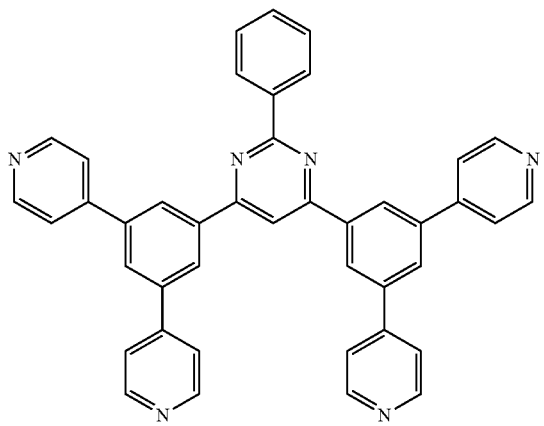

9

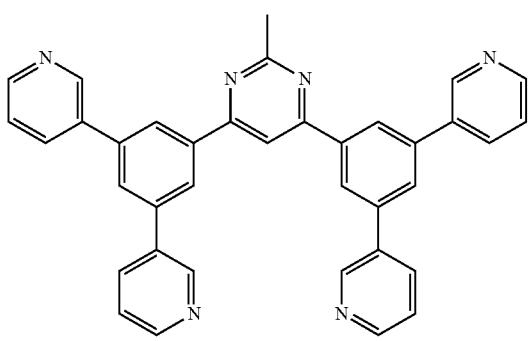

10

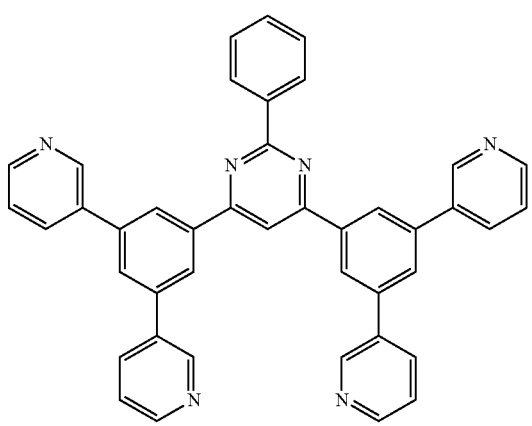

11

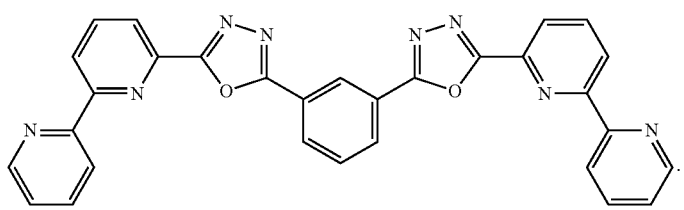

12

Orientation order parameter (S) values of the Compounds 1 to 12 are shown in Table 1 below.

TABLE 1

| Compound | Orientation order parameter (S) |
|---|---|
| 1 | −0.20 |
| 2 | −0.20 |
| 3 | −0.20 |
| 4 | −0.28 |
| 5 | −0.27 |
| 6 | −0.29 |
| 7 | −0.33 |
| 8 | −0.36 |
| 9 | −0.34 |
| 10 | −0.33 |
| 11 | −0.35 |
| 12 | −0.44 |

According to other embodiments, the organic light-emitting apparatus may further include an encapsulating layer encapsulating the organic light-emitting device; and an optical layer disposed on the encapsulating layer. An anisotropic film may be disposed on at least one of the encapsulating layer, the optical layer, and a space between the organic light-emitting device and the encapsulating layer.

Figure 4:
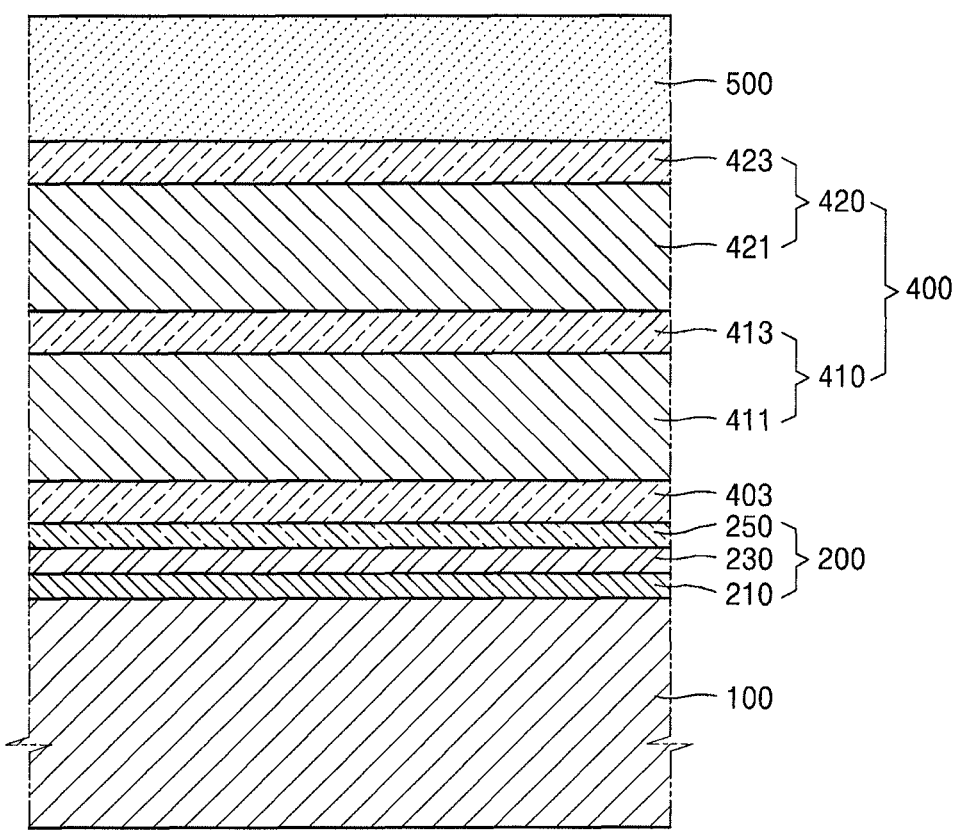
FIG. 4 illustrates a schematic view of an organic light-emitting apparatus according to another embodiment.

Referring to FIG. 4, the organic light-emitting apparatus 20 may include a flexible substrate 100, an organic light-emitting device 200 disposed on the flexible substrate 100, an encapsulating layer 400 encapsulating the organic light-emitting device 200, and an optical layer 500 disposed on the encapsulating layer 400.

The flexible substrate 100 and the organic light-emitting device 200 may be described with reference to FIG. 1.

The encapsulating layer 400 may have a structure in which an n number of encapsulating units are sequentially stacked from the second electrode 250 of the organic light-emitting device 200, wherein n may be an integer of 1 or higher. The encapsulating layer 400 may prevent external environmental moisture and/or oxygen from infiltrating the organic light-emitting device 200.

In more detail, the encapsulating layer 400 may include 1, 2, or 3 encapsulating units and FIG. 4 shows an embodiment in which n is 2.

The encapsulating layer 400 may have a structure in which a first encapsulating unit 410 and a second encapsulating unit 420 are sequentially stacked on the second electrode 250 of the organic light-emitting device 200. The first encapsulating unit 410 may include a first organic film 411 and a first inorganic film 413 sequentially stacked on the second electrode 250 of the organic light-emitting device 200 The second encapsulating unit 420 may include a second organic film 421 and a second inorganic film 423 sequentially stacked on the second electrode 250 of the organic light-emitting device 200.

The first organic film 411 and the second organic film 421 may planarize a bottom structure of each of the first organic film 411 and the second organic film 421, and provide flexibility to the encapsulating layer 400.

At least one of the first organic film 411 and the second organic film 421 may be the anisotropic film 300 described above.

When at least one of the first organic film 411 and the second organic film 421 is the anisotropic material horizontally oriented with respect to a surface of the flexible substrate 100 described above, a separate film or a plate for improving side visibilities of the organic light-emitting apparatus 20 may be omitted among the optical layer 500. Accordingly, an overall thickness may be minimized while reducing side reflectance.

Thicknesses of the first organic film 411 and the second organic film 421 may be each independently about 0.1 μm to about 50 μm, or, for example, about 1 μm to about 10 μm. When the thicknesses of the first organic film 411 and the second organic film 421 satisfy the ranges described above, lower portions of the first organic film 411 and the second organic film 421 may be planarized effectively. Thicknesses of the first organic film 411 and the second organic film 421 may be identical to or different from each other.

The first inorganic film 413 and the second inorganic film 423 may prevent infiltration of external environment moisture and/or oxygen into the organic light-emitting device 200.

The first inorganic film 413 and the second inorganic film 423 may be formed of inorganic materials that are suitable encapsulating layer materials. For example, the first inorganic film 413 and the second inorganic film 423 may each independently include at least one of a metal, a metal nitride, a metal oxide, and a metal oxynitride. For example, the first inorganic film 413 and the second inorganic film 423 may each independently include at least one of aluminium nitride, aluminium oxide, and aluminium oxynitride. According to other embodiments, the first inorganic film 413 and the second inorganic film 423 may each independently include at least one of $SiO_2$, SiC, SiN, SiON, $In_2O_3$, $TiO_2$, and $Al_2O_3$. The first inorganic film 413 and the second inorganic film 423 may include identical materials or different materials.

Thicknesses of the first inorganic film 413 and second inorganic film 423 may be each independently about 100 Å to about 5,000 Å, or, for example, about 500 Å to about 3,000 Å. When the thicknesses of the first inorganic film 413 and the second inorganic film 423 satisfy the ranges described above, the encapsulating layer 400 may provide excellent sealing properties.

The first inorganic film 413 and the second inorganic film 423 may be formed by sputtering, reactive sputtering, chemical vapor deposition (CVD), plasma enhanced chemical vapor deposition, evaporation, electron cyclotron-resonance plasma enhanced chemical vapor deposition, or the like. For example, the first inorganic film 413 may be formed by reactive sputtering using oxygen gas or oxygen plasma or CVD.

The first inorganic film 413 and the second inorganic film 423 may include inorganic materials described above. A film deposition method, such as CVD using plasma, that requires relatively high energy may be used during the formation thereof.

For example, when the first inorganic film 413 is formed by CVD using oxygen plasma, a surface of the first organic film 411 may be exposed to oxygen ions, oxygen radicals, ultraviolet rays, or the like generated due to the oxygen plasma. The oxygen ions, oxygen radicals, and the ultraviolet rays generated due to the oxygen plasma may have sufficient energy to damage organic materials included in the first organic material 411 (for example, decompose the organic materials included in the first organic film 411).

When oxygen plasma or the like is used during the formation of the first inorganic film 413, a Si—C bond of the first organic film 411 may convert into a Si—O due to oxygen ions and oxygen radicals generated from the oxygen plasma, and may, for example, remain in the first organic film 411 as $SiO_2$. Even when the first inorganic film 413 is formed under high energy conditions using oxygen plasma or the like, outgassing of the first organic film 411 caused by the conditions may be prevented. By the same mechanism, even when the second inorganic film 423 is formed under high energy conditions using oxygen plasma or the like, outgassing of the second organic film 421 caused by the conditions may be prevented. Accordingly, the encapsulating layer 400 may effectively seal the organic light-emitting apparatus 20 without outgassing even during a film deposition of the encapsulating layer 400 and/or storage or driving of the organic light-emitting apparatus 20, and the organic light-emitting apparatus 20 may have a long lifespan.

The encapsulating layer 400 of the organic light-emitting apparatus 20 may further include a lower inorganic film 403 disposed between the organic light-emitting device 200 and the first encapsulating unit 410. The lower portion inorganic film 403 may enhance prevention of moisture from percolation and/or prevention of oxygen from percolation of the organic light-emitting device 200. The lower portion inorganic film 403 may be described with reference to the description of the first inorganic film 413.

A thickness of the encapsulating layer 400 may be about 0.1 μm to about 1,000 μm, for example, about 1 μm to about 10 μm. When the thickness of the encapsulating layer 400 is within the ranges described above, the encapsulating layer 400 may effectively prevent infiltration of moisture and/or oxygen into the organic light-emitting device 20 while having flexibility.

The optical layer 500 may be disposed on the encapsulating layer 400 to prevent external reflection and improve visibility and contrast of the organic light-emitting apparatus 20.

Figure 5:
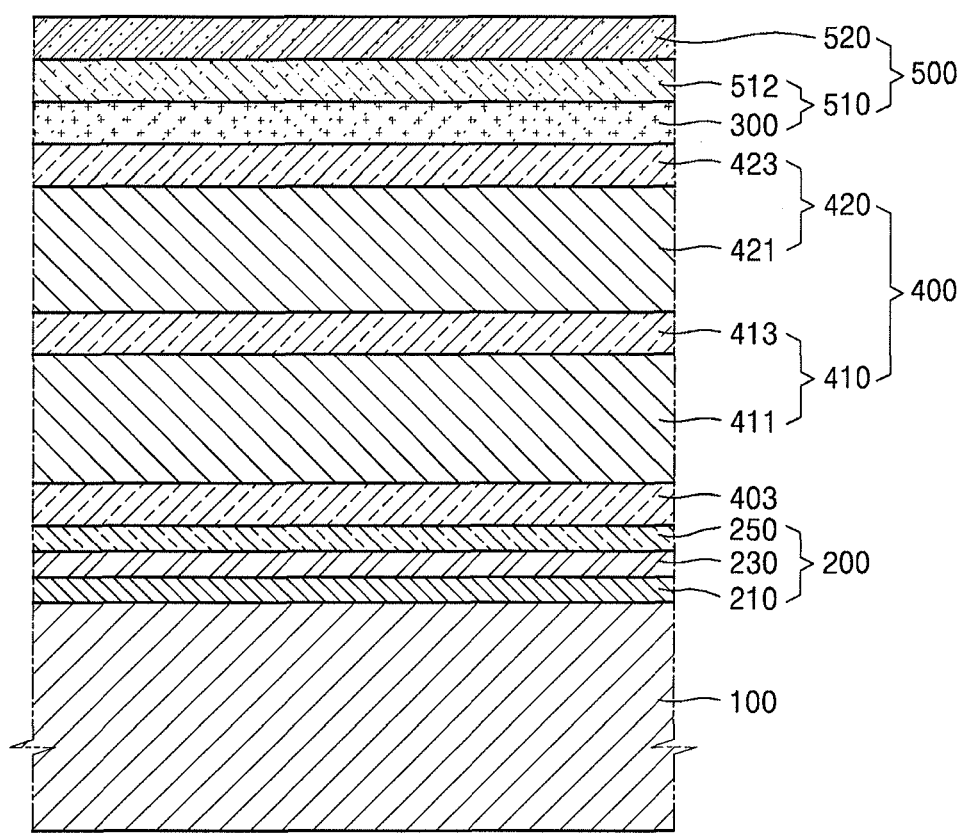
FIG. 5 illustrates a schematic view of an organic light-emitting apparatus according to another embodiment.
Figure 6:
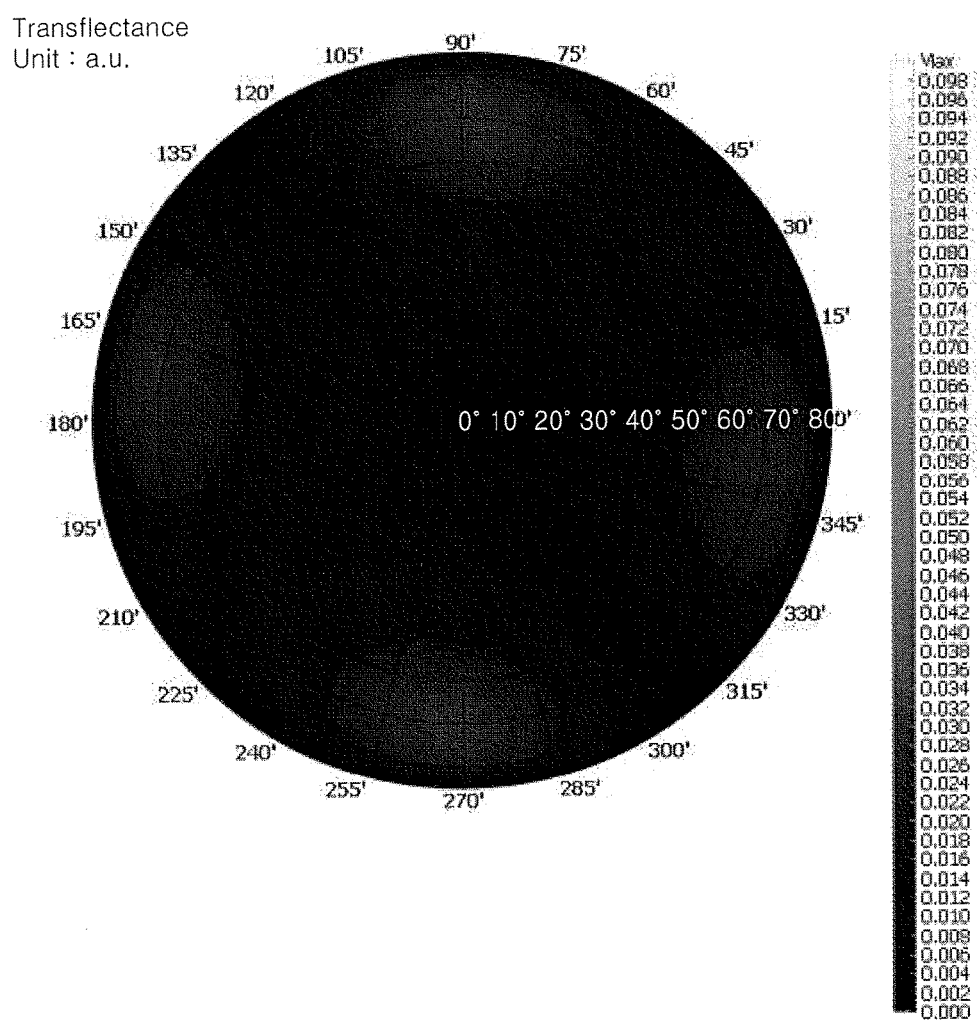
FIG. 6 illustrates a view showing visiblity regarding black color according to visual angles of the organic light-emitting apparatus in Example 1.
Figure 7:
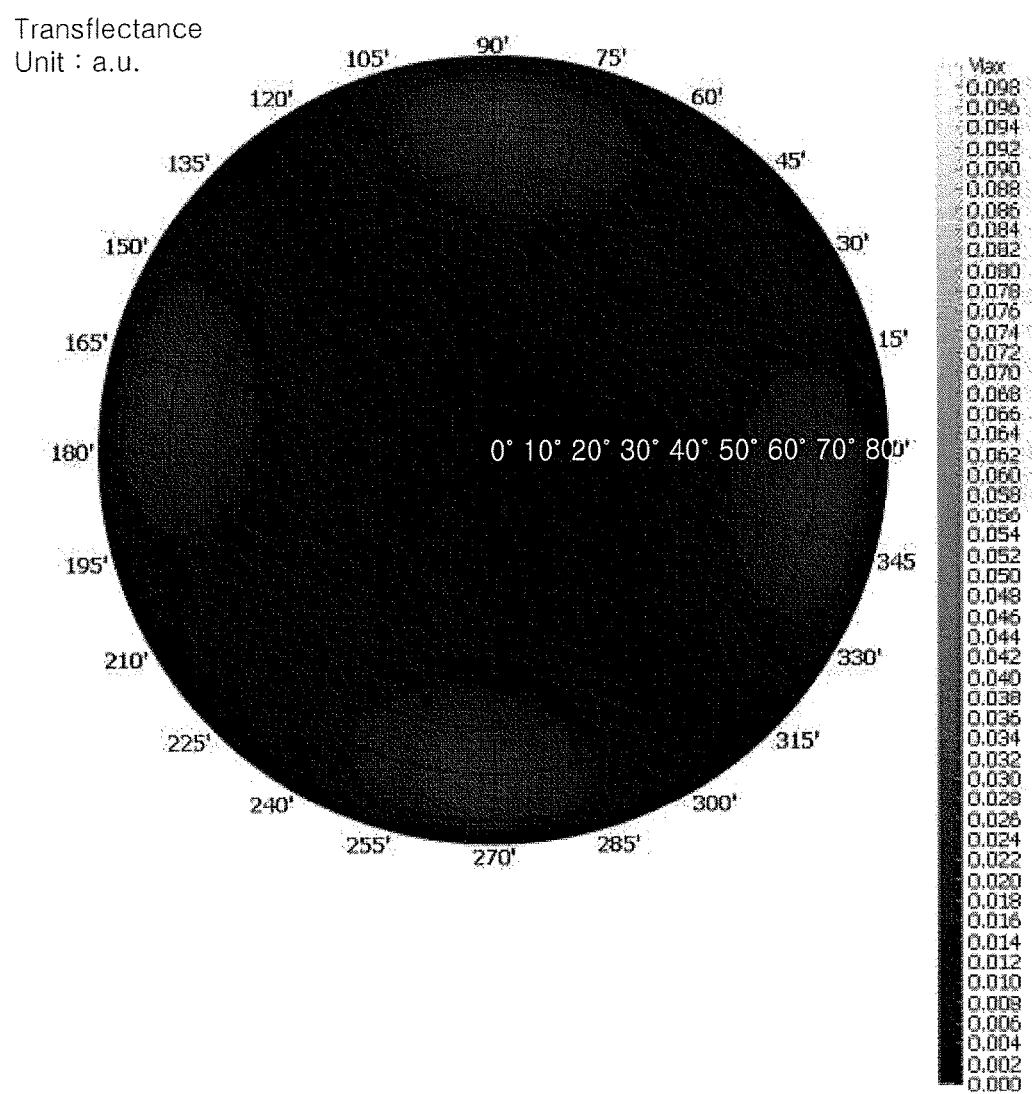
FIG. 7 illustrates a view showing visiblity regarding black color according to visual angles of the organic light-emitting apparatus in Example 2.
Figure 8:
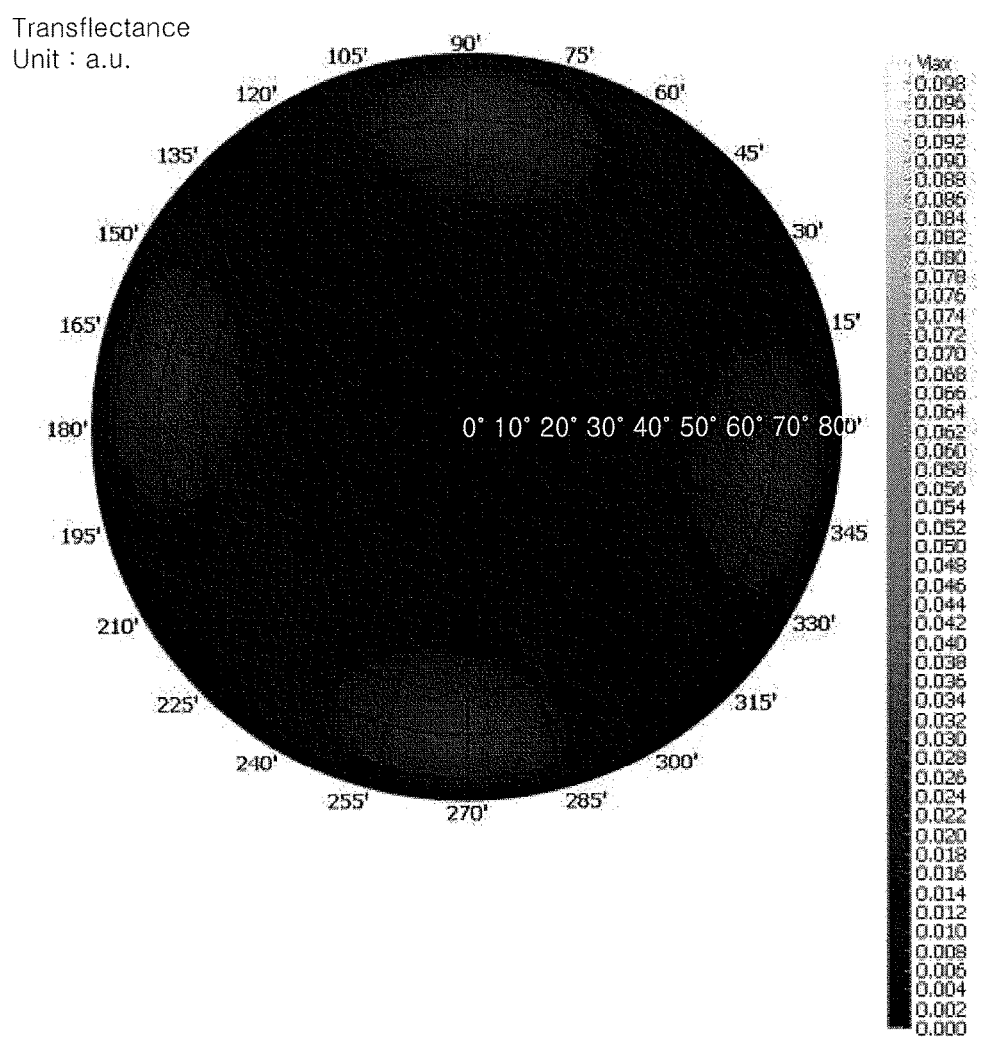
FIG. 8 illustrates a view showing visiblity regarding black color according to visual angles of the organic light-emitting apparatus in Example 3.
Figure 9:
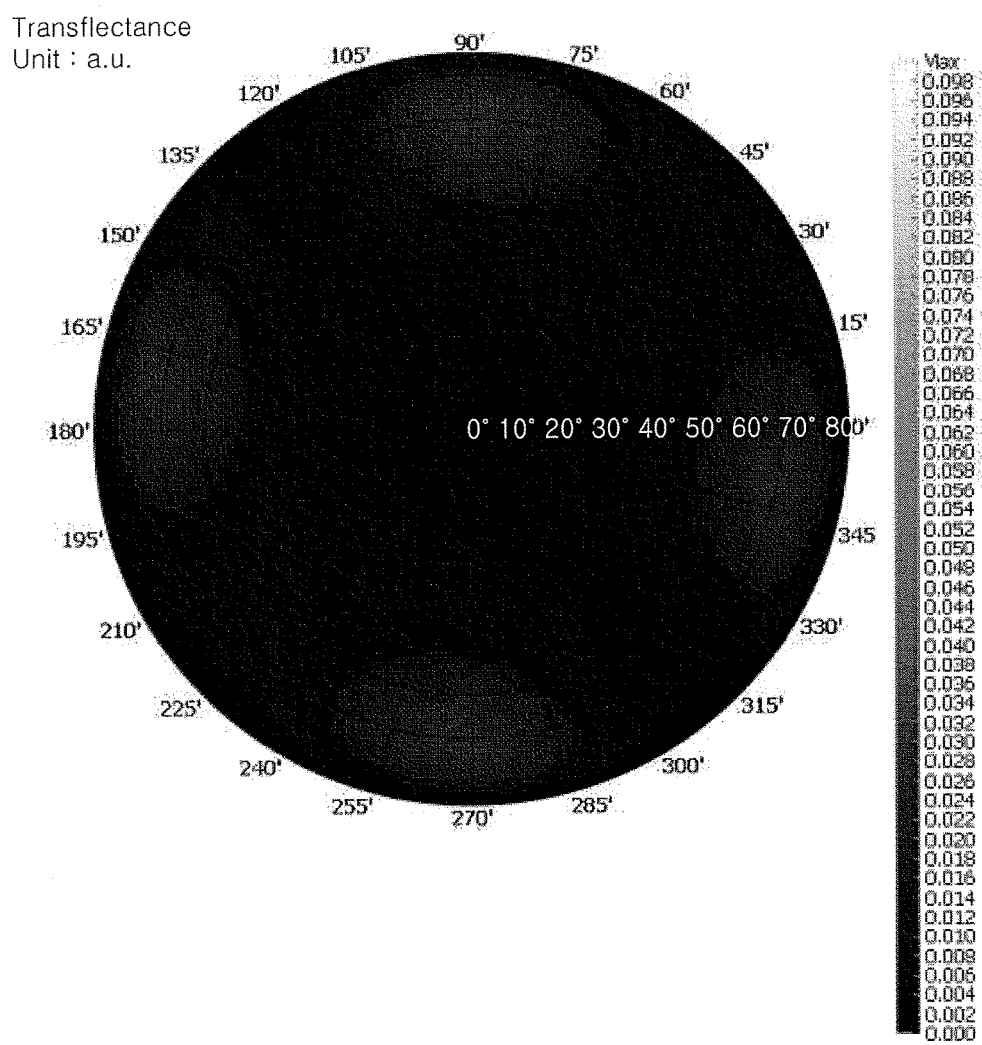
FIG. 9 illustrates a view showing visiblity regarding black color according to visual angles of the organic light-emitting apparatus in Example 4.
Figure 10:
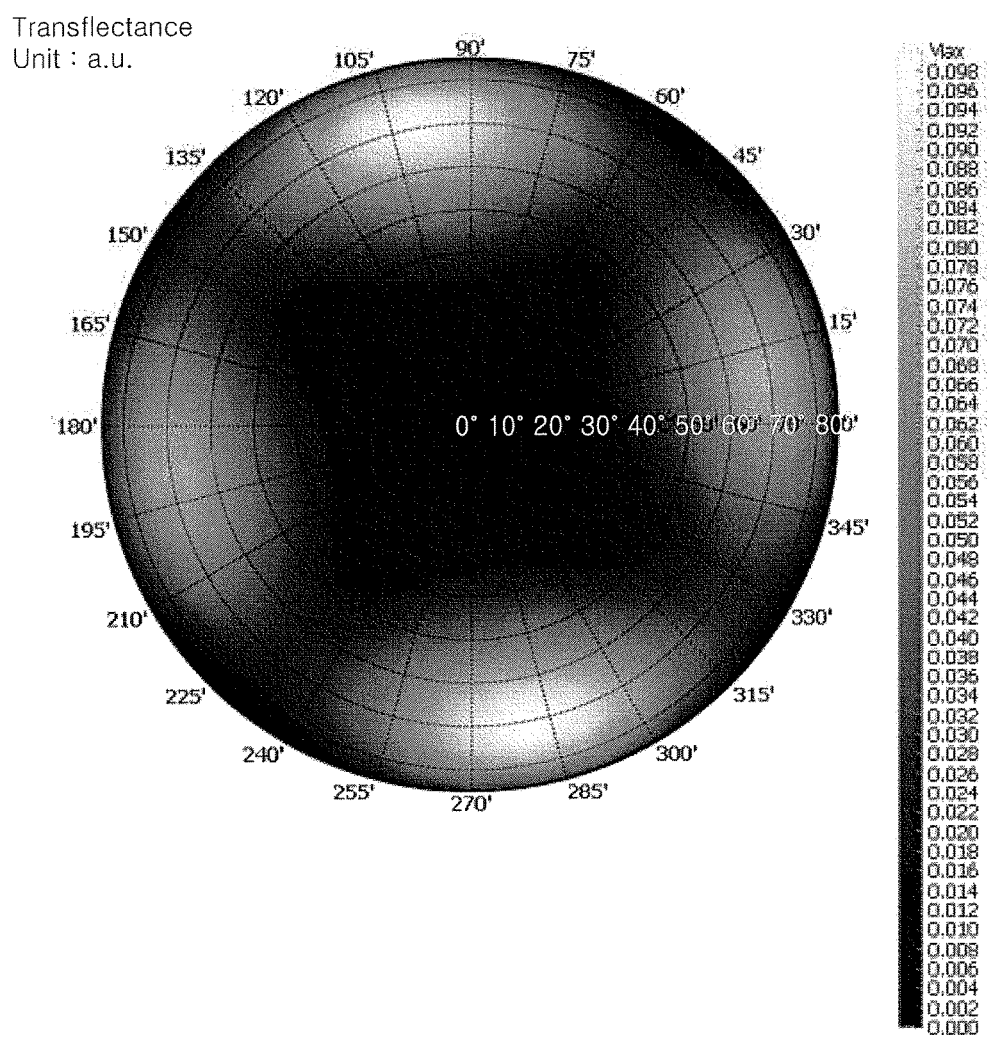
FIG. 10 illustrates a view showing visiblity regarding black color according to visual angles of the organic light-emitting apparatus in Comparative Example 1.
Figure 11:
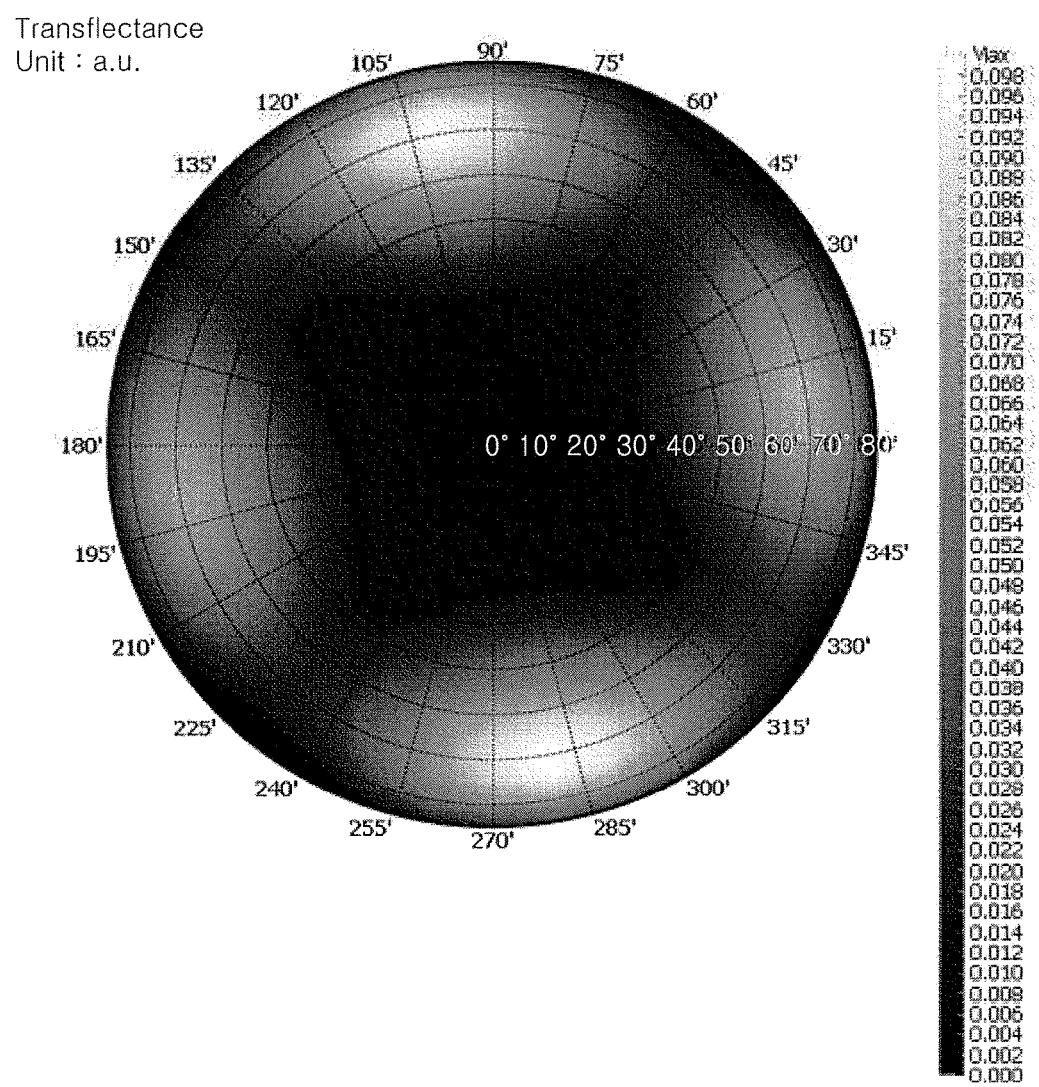
FIG. 11 illustrates a view showing visiblity regarding black color according to visual angles of the organic light-emitting apparatus in Comparative Example 2.
Figure 12:
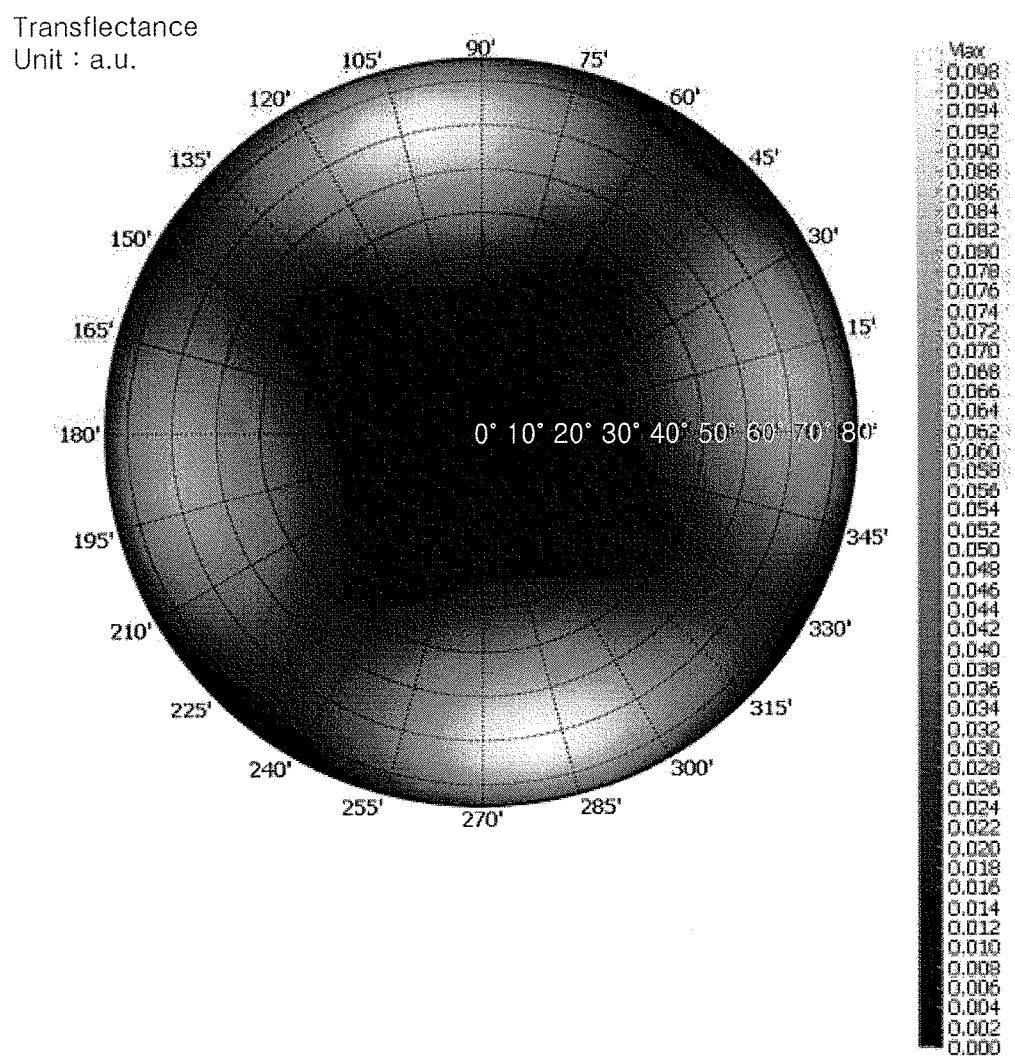
FIG. 12 illustrates a view showing visiblity regarding black color according to visual angles of the organic light-emitting apparatus in Comparative Example 3.

Referring to FIG. 5, the optical layer 500 may include a phase delay layer 510 and a polarizing layer 520. The phase delay layer 510 may include a phase delay plate 512. The anisotropic film 300 may be disposed between the encapsulating layer 400 and the phase delay plate 512.

The phase delay plate 512 may delay a phase of light by ¼ wavelength using a ¼ wave plate to inhibit external light reflection with respect to the front. The anisotropic film 300 may be used along with the phase delay plate 512 to block reflection with respect to the front as well as the side, thereby improving the front and side visibilities.

An adhesive may be disposed between the phase delay plate 512 and the anisotropic film 300 and between the phase delay plate 512 and the polarizing layer 520, to improve adhesiveness between layers.

At least one of a capping layer and a protective layer may be additionally disposed between the second electrode 250 of the organic light-emitting device 200 and the encapsulating layer 400. At least one of the capping layer and the protective layer may include the anisotropic film.

An organic light-emitting apparatus 20 including two encapsulating units (hence, n=2) is illustrated herein. According to embodiments an n of the encapsulating layer in the organic light-emitting apparatus may be 1 or higher. For example, the n may be an integer from 1 to 10. In some embodiments, the n of the encapsulating layer in the organic light-emitting apparatus may be 1, 2, 3, 4, or 5. When the encapsulating layer includes two or more encapsulating units, in some embodiments, some of the encapsulating units may include an organic film and an inorganic film suitable as a general encapsulating.

In some embodiments, a difference of visiblity regarding black color between the front view and the side view, represented by Equation 2 of the organic light-emitting apparatus ($\Delta_{60°-10°}$) may be 0.05 or less:

Difference of visiblity regarding black color between the front view and the side view ($\Delta_{60°-10°}$)= value of visiblity regarding black color at an altitude angle of 60° (visibility regarding black color of the side view)−value of visiblity regarding black color at an altitude angle of 10° (visibility regarding black color of the front view) <Equation 2>

A visiblity regarding black color according to a visual angle of the organic light-emitting apparatus may be measured by an optical simulator. A difference between the visiblity regarding black color of the front and the side may be measured to compare the front and the side visibilities. The value of the visiblity regarding black color at an altitude angle of 10° represents front visiblity and the value of visiblity regarding black color at an altitude angle of 60° represents side visiblity.

In more detail, when a difference of visiblity regarding black color between the front view and the side view ($\Delta_{60°-10°}$) is 0.05 or less, the difference in the visiblity regarding black color of the front and the side of the organic light-emitting apparatus is not great, and thus, an overall visibility of the organic light-emitting apparatus may be improved.

As used herein, the expression "(two or more different layers) are sequentially layered", represents a vertical order of arrangement of two or more layers. A suitable method of layering two or more different layers may be used. A different layer may be disposed between two different layers.

The organic light-emitting apparatus may have other configurations in addition to those described herein.

The term "$C_1$-$C_{60}$ alkyl group" used herein refers to a linear or branched aliphatic hydrocarbon monovalent group having 1 to 60 carbon atoms. Examples thereof include a methyl group, an ethyl group, a propyl group, an isobutyl group, a sec-butyl group, a ter-butyl group, a pentyl group, an iso-amyl group, and a hexyl group. The term "$C_1$-$C_{60}$ alkylene group" used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and detailed examples thereof are a methoxy group, an ethoxy group, and an isopropyloxy group.

The term "$C_2$-$C_{60}$ alkenyl group used herein refers to a hydrocarbon group including at least one carbon-carbon double bond in the middle or terminal of the $C_2$-$C_{60}$ alkyl group. Examples thereof include an ethenyl group, a propenyl group, and a butenyl group. The term "$C_2$-$C_{60}$ alkenylene group" used herein refers to a divalent group having the same structure as the $C_2$-$C_{60}$ alkenyl group.

The term "$C_2$-$C_{60}$ alkynyl group" used herein refers to a hydrocarbon group having at least one carbon-carbon triple bond in the middle or terminal of the $C_2$-$C_{60}$ alkyl group. Examples thereof include an ethynyl group, and a propynyl group. The term "$C_2$-$C_{60}$ alkynylene group" used herein refers to a divalent group having the same structure as the $C_2$-$C_{60}$ alkynyl group.

The term "$C_3$-$C_{10}$ cycloalkyl group" used herein refers to a monovalent hydrocarbon monocyclic group having 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" used herein refers to a divalent group having the same structure as the $C_3$-$C_{10}$ cycloalkyl group.

The term "$C_1$-$C_{10}$ heterocycloalkyl group" used herein refers to a monovalent monocyclic group having at least one hetero atom selected from N, O, P, and S as a ring-forming atom and 1 to 10 carbon atoms. Examples thereof include a tetrahydrofuranyl group, and a tetrahydrothiophenyl group. The term "$C_1$-$C_{10}$ heterocycloalkylene group" used herein refers to a divalent group having the same structure as the $C_1$-$C_{10}$ heterocycloalkyl group.

The term "$C_3$-$C_{10}$ cycloalkenyl group" used herein refers to a monovalent monocyclic group that has 3 to 10 carbon atoms and at least one double bond in the ring thereof and does not have aromacity. Examples thereof include a cyclopentenyl group, a cyclohexenyl group, and a cycloheptenyl group. The term "$C_3$-$C_{10}$ cycloalkenylene group" used herein refers to a divalent group having the same structure as the $C_3$-$C_{10}$ cycloalkenyl group.

The term "$C_1$-$C_{10}$ heterocycloalkenyl group" used herein refers to a monovalent monocyclic group that has at least one hetero atom selected from N, O, P, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" used herein refers to a divalent group having the same structure as the $C_1$-$C_{10}$ heterocycloalkenyl group.

The term "$C_6$-$C_{60}$ aryl group" used herein refers to a monovalent group having a carbocyclic aromatic system having 6 to 60 carbon atoms The term "$C_6$-$C_{60}$ arylene group" used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" used herein refers to a monovalent group having a carboncyclic aromatic system that has at least one hetero atom selected from N, O, P, and S as a ring-forming atom, and 1 to 60 carbon atoms. The term "$C_1$-$C_{60}$ heteroarylene group" used herein refers to a divalent group having a carbocyclic aromatic system that has at least one hetero atom selected from N, O, P, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" used herein refers to a monovalent group (for example, having 8 to 60 carbon atoms) that has two or more rings condensed to each other, only carbon atoms as a ring forming atom, and non-aromacity in the entire molecular structure. A detailed example of the monovalent non-aromatic condensed polycyclic group is a fluorenyl group. The term "divalent non-aromatic condensed polycyclic group" used herein refers to a divalent group having the same structure as the monovalent non-aromatic condensed polycyclic group.

The term "monovalent non-aromatic condensed heteropolycyclic group" used herein refers to a momovalent group (for example, having 1 to 60 carbon atoms) that has two or more rings condensed to each other, has a heteroatom selected from N, O P, and S, other than carbon atoms, as a ring forming atom, and has non-aromacity in the entire molecular structure. An example of the monovalent non-aromatic condensed heteropolycyclic group is a carbazolyl group. The term "divalent non-aromatic condensed heteropolycyclic group" used herein refers to a divalent group having the same structure as the monovalent non-aromatic condensed heteropolycyclic group.

As an example, at least one of substituents of the substituted $C_2$-$C_{10}$ alkenylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

a $C_1$-$C_{60}$ alkyl group, a $C_1$-$C_{60}$ alkenyl group, a $C_1$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkenyl group, a $C_1$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic heterocondensed polycyclic group, —$Si(Q_{21})(Q_{22})$, —$B(Q_{23})(Q_{24})(Q_{25})$, and —$N(Q_{26})(Q_{27})$; and —$Si(Q_{31})(Q_{32})(Q_{33})$, —$B(Q_{34})(Q_{35})$ and —$N(Q_{36})(Q_{37})$;

wherein $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, at least one of substituents of substituents of the substituted $C_2$-$C_{10}$ alkenylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_6$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —$N(Q_{11})(Q_{12})$, —$B(Q_{13})(Q_{14})$ and —$Si(Q_{15})(Q_{16})(Q_{17})$;

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —$N(Q_{21})(Q_{22})$, —$B(Q_{23})(Q_{24})$ and —$Si(Q_{25})(Q_{26})(Q_{27})$; and —$N(Q_{31})(Q_{32})$, —$B(Q_{33})(Q_{34})$, and —$Si(Q_{35})(Q_{36})(Q_{37})$;

wherein $Q_{11}$ to $Q_{17}$, $Q_{21}$ to $Q_{27}$, and $Q_{31}$ to $Q_{37}$ may be each independently, selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

A flexible substrate on which an organic light-emitting device including a first electrode, an emission layer, and a second electrode was formed was prepared. $Alq_3$ was deposited thereon to form a capping layer having a thickness of 680 Å to cover the organic light-emitting device and then LiF was deposited on the capping layer into a thickness of 500 Å to form a protective layer.

Thereafter, $Al_2O_3$ was deposited on the protective layer to form a lower inorganic film in a thickness of 1,000 Å, Compound 5 was deposited on the lower inorganic film to form a first organic film having a thickness of 1 μm (10,000 Å), $SiN_x$ was deposited on the first organic film to form a first inorganic film having a thickness of 1,000 Å, Compound 5 below was formed on the second inorganic film to form a second organic film having a thickness of 3 μm (30,000 Å), and then $SiN_x$ was deposited on the second organic film to form a second inorganic film having a thickness of 1,000 Å, to complete the encapsulating layer.

Thereafter, a ¼ wave plate and a polarizing plate were deposited on the encapsulating layer to complete the optical layer, to thereby manufacture an organic light-emitting apparatus.

<Compound 5>

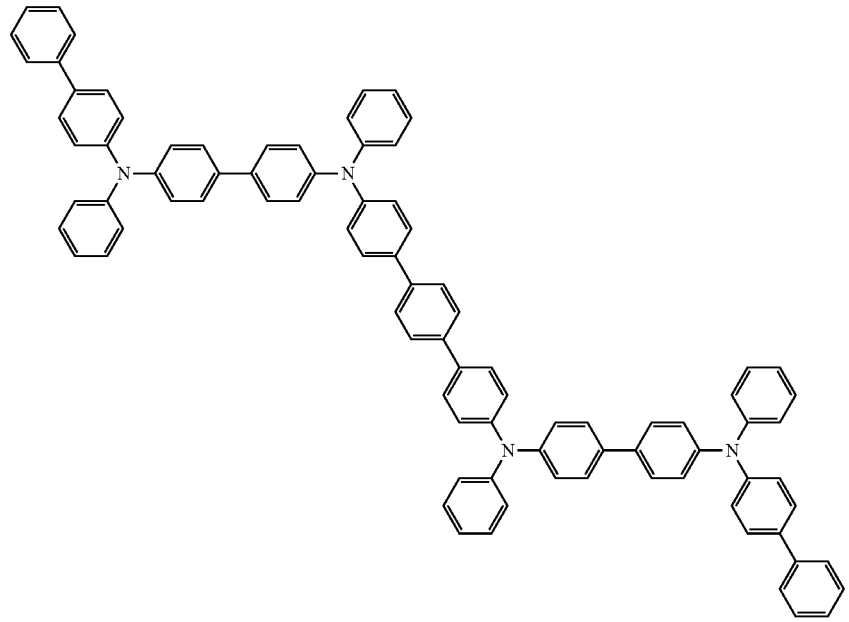

Example 2

An organic light-emitting apparatus was manufactured in the same manner as in Example 1, except for using Compound 12 instead of Compound 5 when forming an organic film.

<Compound 12>

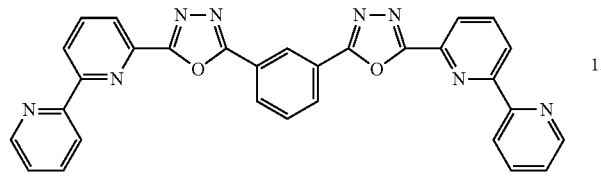

Example 3

An organic light-emitting apparatus was manufactured in the same manner as in Example 1, except for using an acrylate-based organic film manufactured in the manner described below instead of Compound 5 and depositing Compound 5 between the encapsulating layer and the ¼ wave plate when forming an organic film.

A method of manufacturing the acrylate-based organic film was as follows:

20 mmol of lauryl acrylate, 70 mmol of 1,12-dodecandiol dimethacrylate, and 10 mmol of trimethylol propane triacrylate were deposited on the lower portion inorganic film by using a flash evaporation apparatus (SNU equipment), and then the same was exposed to light from a light source having a wavelength of 390 nm to manufacture the acrylate-based organic film.

Example 4

An organic light-emitting apparatus was manufactured in the same manner as in Example 2, except for using an acrylate-based organic film instead of Compound 12 and depositing Compound 12 between the encapsulating layer and the ¼ wave plate when forming the organic film.

Comparative Example 1

An organic light-emitting apparatus was manufactured in the same manner as in Example 1, except for using an acrylate-based organic film instead of Compound 5 when forming the organic film.

Comparative Example 2

An organic light-emitting apparatus was manufactured in the same manner as in Example 1, except for using TPD instead of Compound 5 when forming the organic film.

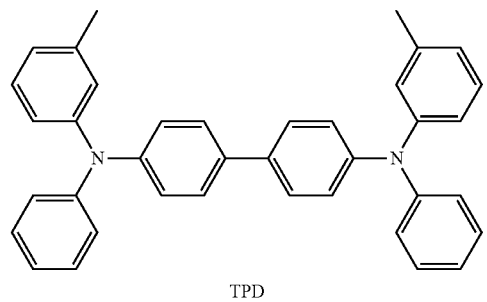 [SMILES: Cc1cccc(N(c2ccccc2)c2ccc(-c3ccc(N(c4ccccc4)c4cccc(C)c4)cc3)cc2)c1 ; "TPD"]

TPD

Comparative Example 3

An organic light-emitting apparatus was manufactured in the same manner as in Example 1, except for using OXD7 instead of Compound 5 when forming the organic film.

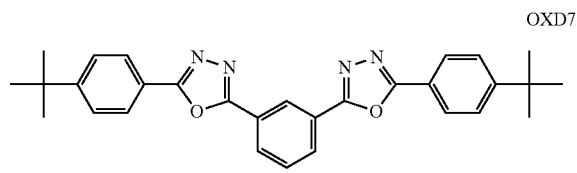 [SMILES: CC(C)(C)c1ccc(-c2nnc(-c3cccc(-c4nnc(-c5ccc(C(C)(C)C)cc5)o4)c3)o2)cc1]

OXD7

Evaluation Example 1

To identify side visibility, visiblity regarding black color according to visual angles of the organic light-emitting apparatuses of Examples 1 to 4 and Comparative Examples 1 to 3 was measured through an optical simulator, Techwiz (manufactured by SANAYI System) The results obtained therefrom are shown in Table 1 and FIGS. 6 to 12. In the above drawings, the angles indicated on the circumference are azimuth angle (indicated in black) and the angles indicated from the center to the periphery of the circle are altitude angles (indicated in white). Values of visiblity regarding black color at altitude angles from 0° to 80° measured at an azimuth of 0° and a difference of visiblity regarding black color between the front view and the side view ($\Delta_{60°-10°}$) are shown in Table 2 below. The difference of visiblity regarding black color between the front view and the side view ($\Delta_{60°-10°}$) may be represented by Equation 2 below.

Difference of visiblity regarding black color between the front view and the side view ($\Delta_{60°-10°}$) =value of visiblity regarding black color at a altitude angle of 60° (visibility regarding black color of the side view)−value of visiblity regarding black color at a altitude angle of 10° (visibility regarding black color of the front view)   <Equation 2>

TABLE 2

| | \multicolumn{9}{c}{Altitude Angle (°)} | |
| | 0 | 10 | 20 | 30 | 40 | 50 | 60 | 70 | 80 | $\Delta_{60°\text{-}10°}$ |
|---|---|---|---|---|---|---|---|---|---|---|
| Example 1 | 0.000 | 0.002 | 0.002 | 0.010 | 0.024 | 0.034 | 0.036 | 0.040 | 0.028 | 0.034 |
| Example 2 | 0.000 | 0.002 | 0.002 | 0.010 | 0.020 | 0.028 | 0.034 | 0.038 | 0.028 | 0.032 |
| Example 3 | 0.000 | 0.000 | 0.002 | 0.012 | 0.024 | 0.036 | 0.038 | 0.044 | 0.030 | 0.038 |
| Example 4 | 0.000 | 0.002 | 0.004 | 0.012 | 0.022 | 0.036 | 0.036 | 0.042 | 0.026 | 0.036 |
| Comp. Example 1 | 0.000 | 0.002 | 0.002 | 0.040 | 0.062 | 0.072 | 0.078 | 0.080 | 0.054 | 0.076 |
| Comp. Example 2 | 0.000 | 0.002 | 0.002 | 0.038 | 0.060 | 0.070 | 0.076 | 0.082 | 0.056 | 0.074 |
| Comp. Example 3 | 0.000 | 0.002 | 0.004 | 0.040 | 0.064 | 0.074 | 0.080 | 0.082 | 0.060 | 0.078 |

As shown in Table 2 and FIGS. 6 to 12, it may be seen that visiblity regarding black color of the front of the organic light-emitting apparatuses in Examples 1 to 4 and Comparative Examples 1 to 3 are excellent.

On the other hand, the visiblity regarding black color of the organic light-emitting apparatuses in Comparative Examples 1 to 3 decreases towards the side thereof, whereas, the visiblity regarding black color of the organic light-emitting apparatuses in Examples 1 to 4 does not greatly decrease compared with the front visiblity regarding black color. In more detail, when differences of visiblity regarding black color between the front view and the side view ($\Delta_{60°\text{-}10°}$) in Table 1 are compared, the organic light-emitting apparatuses in Examples 1 to 4 showed a value of 0.05 or less, while the organic light-emitting apparatuses in Comparative Examples 1 to 3 showed a value of 0.07 or greater. This suggests that in the case of organic light-emitting apparatuses according to Comparative Examples 1 to 3, external light source is reflected from the side to display white light. The organic light-emitting apparatuses in Examples 1 to 4 include an anisotropic film including an anisotropic material that is horizontally oriented with respect to the flexible substrate, which blocks the reflection of the external light source to improve the side visiblity regarding black color.

Also, in Examples 1 and 2, the anisotropic film was deposited instead of a conventional acrylate-based organic film. Thus, it may be concluded that the side visiblity of the organic light-emitting apparatus may be improved without increasing the thickness of the organic light-emitting apparatus.

By way of summation and review, an organic light-emitting device may degrade due to oxygen and/or moisture. Thus, the organic light-emitting device may be sealed to provide a high-quality organic light-emitting device.

An external reflection, which is a reflection of external light that may be caused by, for example, electrodes of the organic light-emitting device and various other metal wirings, may occur. Accordingly, it is desirable to improve front and side visibility of the organic light-emitting apparatus.

Embodiments provide an organic light-emitting apparatus that has an improved visibility to block external light reflection.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting apparatus, comprising:

a flexible substrate;

an organic light-emitting device on the flexible substrate, the light emitting device including a first electrode, an emission layer, and a second electrode sequentially disposed on the flexible substrate; and an anisotropic film on the second electrode outside of the organic light-emitting device, the anisotropic film being on an opposite side of the second electrode from the emission layer and the first electrode;

wherein:

the anisotropic film includes an anisotropic material horizontally oriented with respect to a surface of the flexible substrate, an orientation order parameter of the anisotropic material is about −0.5 to about −0.2, and the anisotropic material includes a compound represented by any one of Formulae 1 to 3 below:

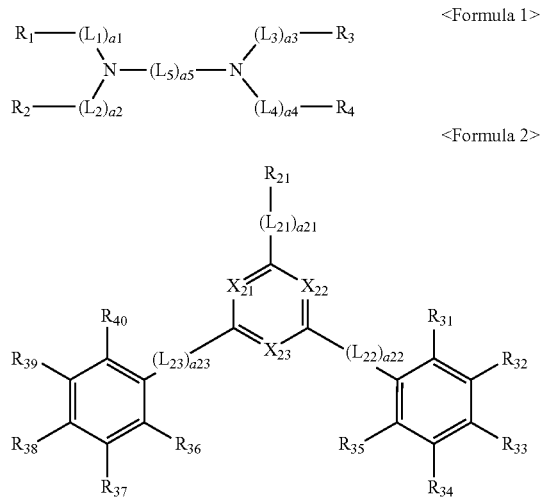

-continued

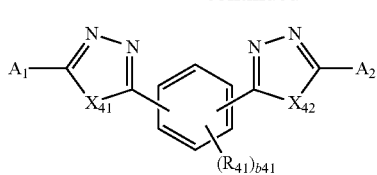
<Formula 3>

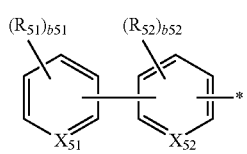
<Formula 4>

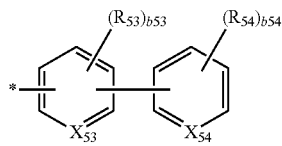
<Formula 5> wherein, in Formulae 1 to 3, $L_1$ to $L_5$ and $L_{21}$ to $L_{23}$ are each independently one of a substituted or unsubstituted $C_2$-$C_{10}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a4 are each independently 0, 1, 2, or 3, wherein, when a1 is 2 or greater, two or more $L_1$ are identical to or different from each other, when a2 is 2 or greater, two or more $L_2$ are identical to or different from each other, when a3 is 2 or greater, two or more $L_3$ are identical to or different from each other, and, when a4 is 2 or greater, two or more $L_4$ are identical to or different from each other;

a1+a2+a3+a4 is 1 or greater;

a5 is 2, 3, 4, 5, 6, or 7, wherein, when a5 is 2 or greater, two or more $L_5$ are identical to or different from each other;

a21 to a23 are each independently 0, 1, or 2, wherein, when a21 is 2 or greater, two or more $L_{21}$ are identical to or different from each other, when a22 is 2 or greater, two or more $L_{22}$ are identical to or different from each other, and, when a23 is 2 or greater, two or more $L_{23}$ are identical to or different from each other;

$X_{21}$ is N or $C(R_{61})$, $X_{22}$ is N or $C(R_{62})$, and $X_{23}$ is N or $C(R_{63})$;

$X_{41}$ and $X_{42}$ are each independently O or S;

$A_1$ is represented by Formula 4, $A_2$ is represented by Formula 5, $X_{51}$ is $C(R_{71})$ or N, $X_{52}$ is $C(R_{72})$ or N, $X_{53}$ is $C(R_{73})$ or N, $X_{54}$ is $C(R_{74})$ or N, at least one of $X_{51}$ and $X_{52}$ is N, and at least one of $X_{53}$ and $X_{54}$ is N;

$R_1$ to $R_4$ and $R_{31}$ to $R_{40}$ are each independently one of a hydrogen, $N(R_{11})(R_{12})$, a substituted or unsubstituted $C_6$-$C_{60}$ aryl group, a substituted or unsubstituted $C_1$-$C_{60}$ heteroaryl group, a monovalent non-aromatic condensed polycyclic group and a substituted or unsubstituted monovalent non-aromatic condensed heteropolycyclic group, each of $R_1$, $R_2$, $R_3$, and $R_4$ is a ring-forming substituent, and $R_1$, $R_2$, $R_3$, and $R_4$ are connectable to each other to form a ring;

$R_{11}$, $R_{12}$, $R_{21}$, $R_{41}$, $R_{51}$ to $R_{54}$, $R_{61}$ to $R_{63}$, and $R_{71}$ to $R_{73}$ are each independently one of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_4)(Q_5)$, and $N(Q_6)(Q_7)$, b41 is 0, 1, 2, 3, or 4 and when b41 is 2 or greater, two or more $R_{41}$ are identical to or different from each other;

b51 and b54 are each independently 0, 1, 2, 3, or 4, wherein, when b51 is 2 or greater, two or more $R_{51}$ are identical to or different from each other and are connectable to each other to form a ring, and, when b52 is 2 or greater, two or more $R_{52}$ are identical to or different from each other and are connectable to each other to form a ring;

b52 and b53 are each independently 0, 1, 2, or 3, wherein, when b52 is 2 or greater, two or more $R_{52}$ are identical to or different from each other and are connectable to each other to form a ring, and, when b53 is 2 or greater, two or more $R_{53}$ are identical to or different from each other and are connectable to each other to form a ring;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group is one of:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
- a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group(arylthio), a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —B($Q_{14}$)($Q_{15}$), and —N($Q_{16}$)($Q_{17}$);
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —B($Q_{24}$)($Q_{25}$) and —N($Q_{26}$)($Q_{27}$); and
- —Si($Q_{31}$)($Q_{32}$)($Q_{33}$), —B($Q_{34}$)($Q_{35}$), and —N($Q_{36}$)($Q_{37}$);
- wherein $Q_{11}$ to $Q_{17}$, $Q_{21}$ to $Q_{27}$ and $Q_{31}$ to $Q_{37}$ are each independently one of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting apparatus as claimed in claim 1, wherein in Formulae 1 and 2, $L_1$ to $L_5$, and $L_{21}$ to $L_{23}$ are each independently represented by one of Formulae 5-1 to 5-16 below;

a1 to a4 are each independently selected from 0, 1, and 2, a5 is selected from 2, 3, 4, 5, and 6, a21 is 0, and a22 and a23 are each independently selected from 0 and 1:

Formula 5-1

Formula 5-2

Formula 5-3

Formula 5-4

Formula 5-5

Formula 5-6

Formula 5-7

Formula 5-8

Formula 5-9

-continued

Formula 5-10

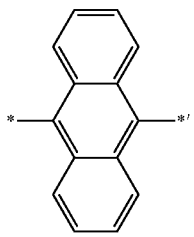

Formula 5-11

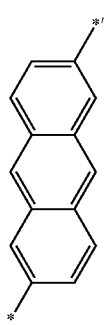

Formula 5-12

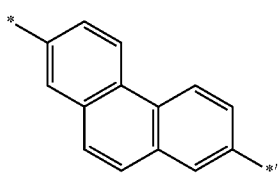

Formula 5-13

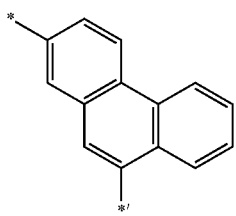

Formula 5-14

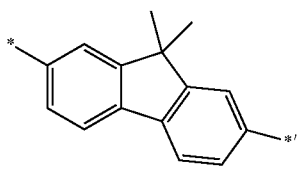

Formula 5-15

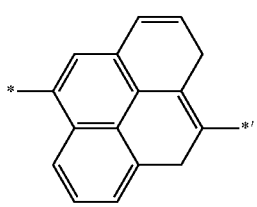

Formula 5-16

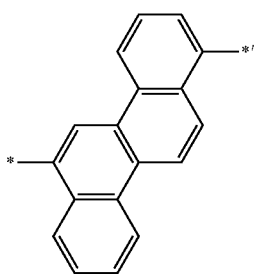

wherein * and *' in Formulae 5-1 to 5-16 indicates a binding site to a neighboring atom.

wherein * and *' in Formulae 5-1 to 5-16 indicate a binding site to a neighboring atom.

3. The organic light-emitting apparatus as claimed in claim 1, wherein in Formulae 1 to 3, $X_{21}$ is N, $X_{22}$ is N, and $X_{23}$ is $C(R_{63})$;

$X_{41}$ and $X_{42}$ are O;

$R_1$ to $R_4$, and $R_{31}$ to $R_{40}$ are each independently selected from one of Formulae 6-1 to 6-15 below, $R_{11}$, $R_{12}$, $R_{21}$, $R_{41}$, and $R_{63}$ are each independently selected from a hydrogen, a methyl group, a phenyl group, or a biphenyl group:

Formula 6-1

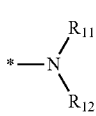

Formula 6-2

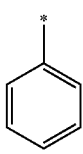

Formula 6-3

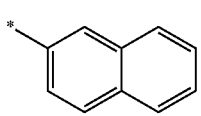

Formula 6-4

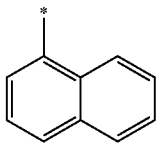

Formula 6-5

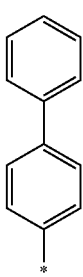

-continued
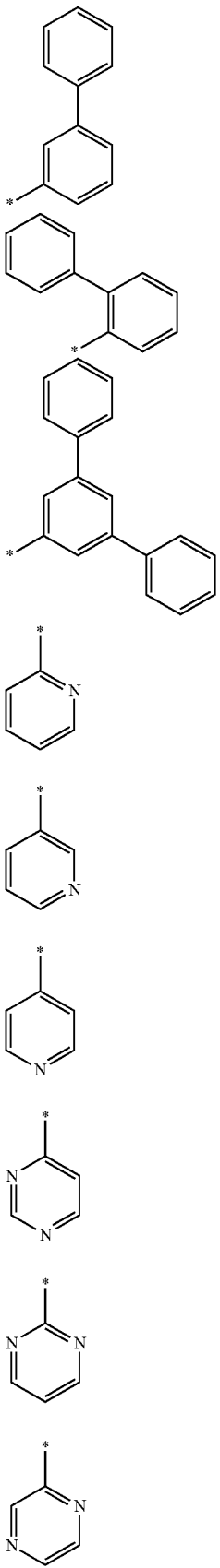
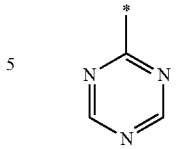
*in Formulae 6-1 to 6-15 indicates a binding site to a neighboring atom.
4. The organic light-emitting apparatus as claimed in claim 1, wherein in Formulae 1 to 3, $A_1$ and $A_2$ are each independently represented by one of Formulae 7-1 to 7-16 below:
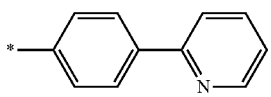
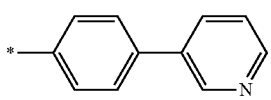
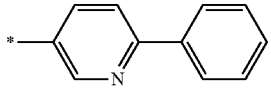
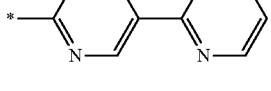
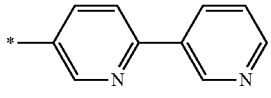
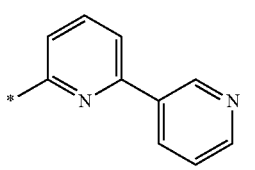
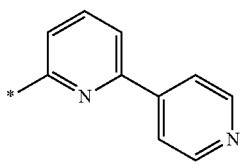
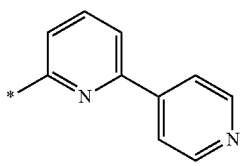

-continued
Formula 7-10
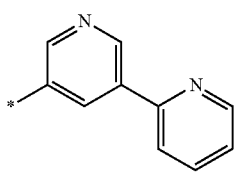
Formula 7-11
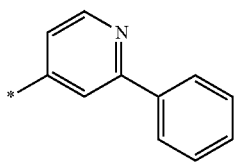
Formula 7-12
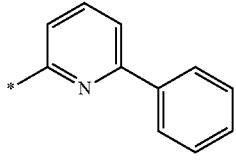
Formula 7-13
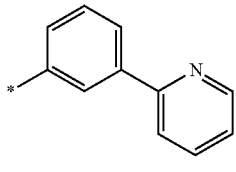
Formula 7-14
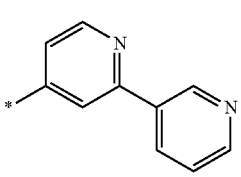
Formula 7-15
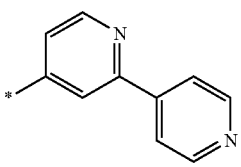
Formula 7-16
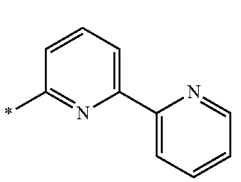
*in Formulae 7-1 to 7-16 indicates a binding site to a neighboring atom.
5. The organic light-emitting apparatus as claimed in claim 1, wherein the anisotropic material includes a compound represented by one of Formulae 1-1 to 1-5, 2-1, 2-2, and 3-1 to 3-4 below:
<Formula 1-1>
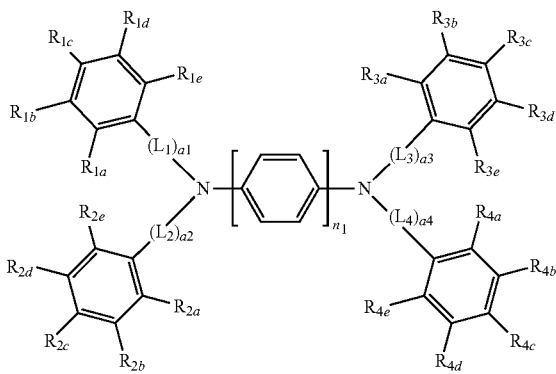
<Formula 1-2>
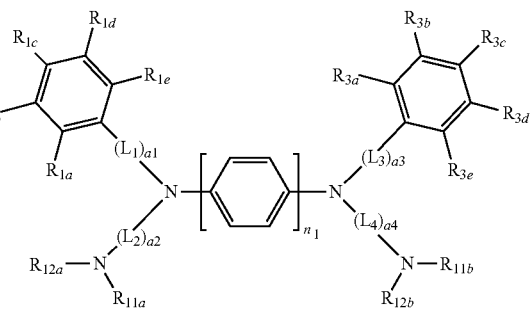
<Formula 1-3>
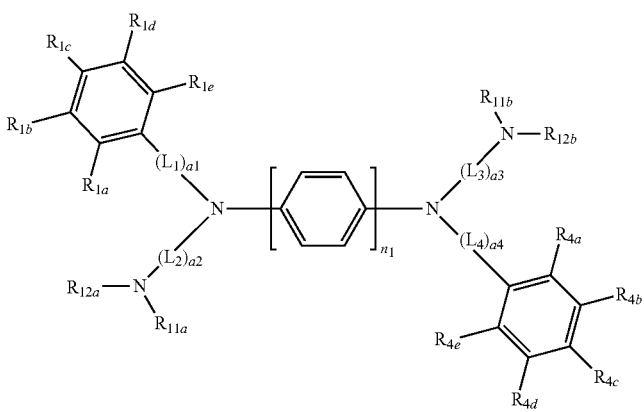

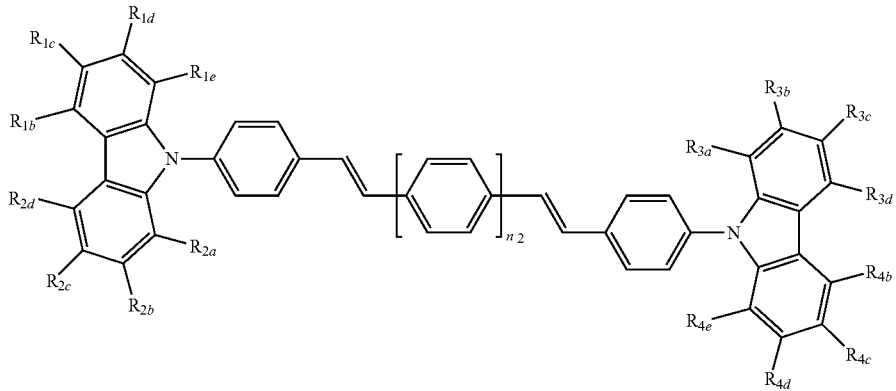
<Formula 1-4>
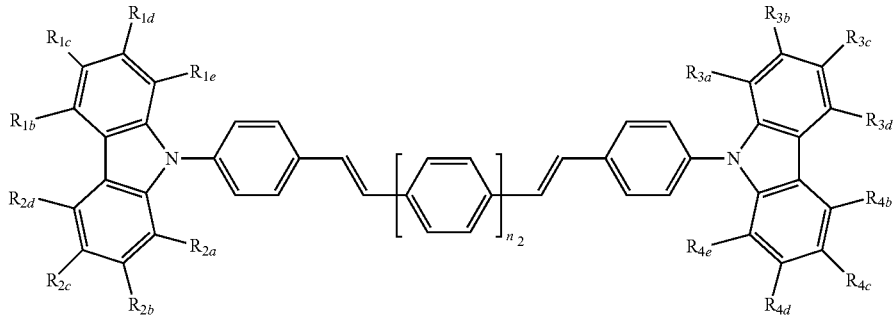
<Formula 1-5>
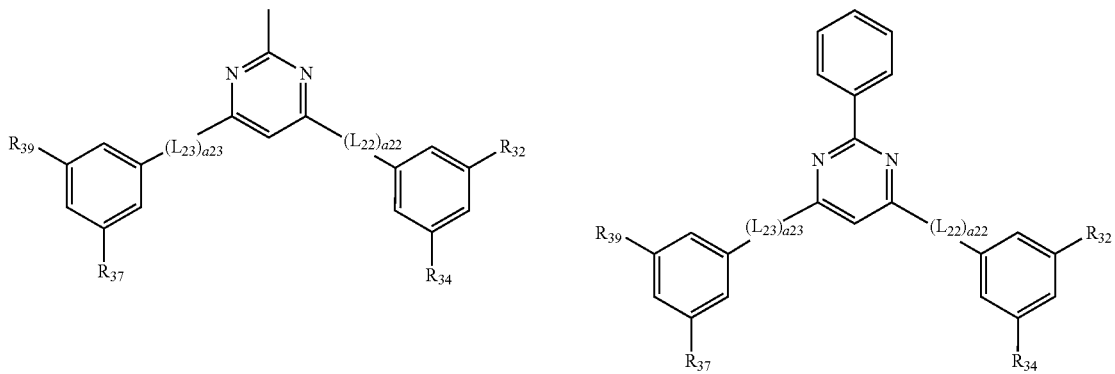
<Formula 2-1>
<Formula 2-2>
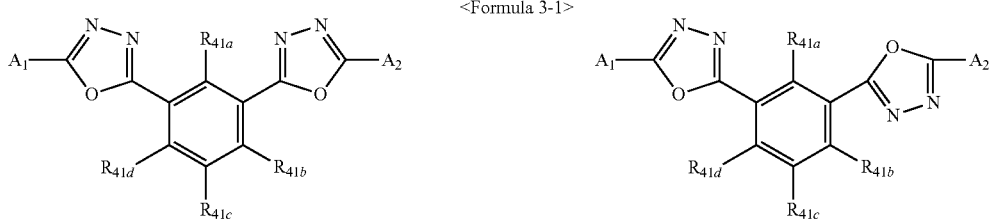
<Formula 3-1>
<Formula 3-2>

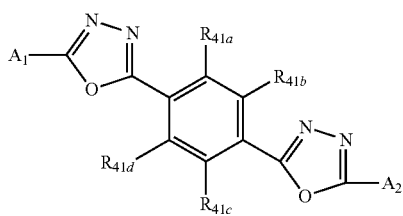

<Formula 3-3>

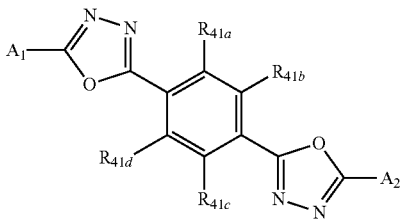

<Formula 3-4> wherein in Formulae 1-1 to 1-5, 2-1 to 2-2, and 3-1 to 3-4,
$L_1$ to $L_4$, $L_{22}$, $L_{23}$, a1 to a4, a22, a23, $R_{32}$, $R_{34}$, $R_{37}$, and $R_{39}$ are the same as defined in claim 1, n1 is 2 or 3, n2 is 1 or 2, $R_{1a}$ to $R_{1e}$ are each independently understood by referring to the description of $R_1$, $R_{2a}$ to $R_{2e}$ are each independently understood by referring to the description of $R_2$, $R_{3a}$ to $R_{3e}$ are each independently understood by referring to the description of $R_3$, and $R_{4a}$ to $R_{4e}$ are each independently understood by referring to the description of $R_1$, $R_{11a}$ and $R_{11b}$ are each independently understood by referring to the description of $R_{11}$, $R_{12a}$ and $R_{12b}$ are each independently understood by referring to the description of $R_{12}$, $R_{41a}$ to $R_{41d}$ are each independently understood by referring to the description of $R_{41}$, and A1 and A2 are each independently represented by one of Formulae 8-1 to 8-3 below, Formula 8-1

Formula 8-2

Formula 8-3

*in Formulae 8-1 to 8-3 indicates a binding site to a neighboring atom.

6. The organic light-emitting apparatus as claimed in claim 1, wherein the anisotropic material includes a compound represented by one of Compounds 1 to 12 below:

1

-continued
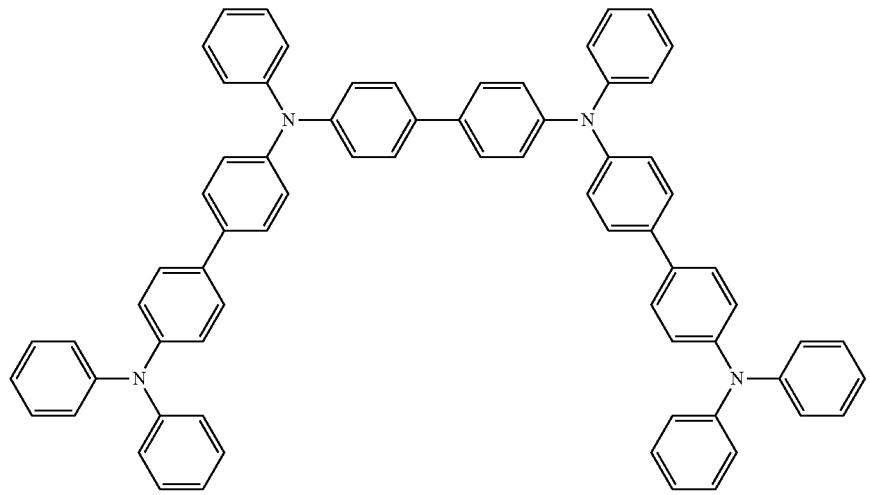
2
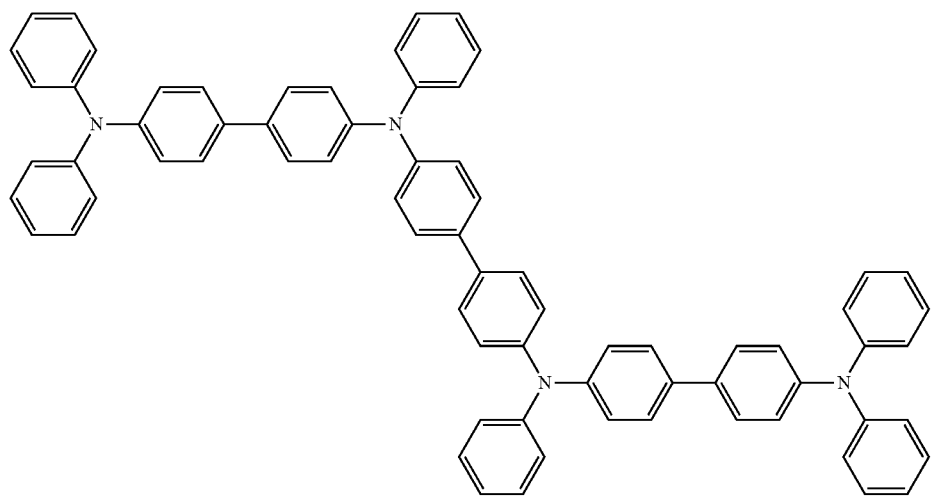
3
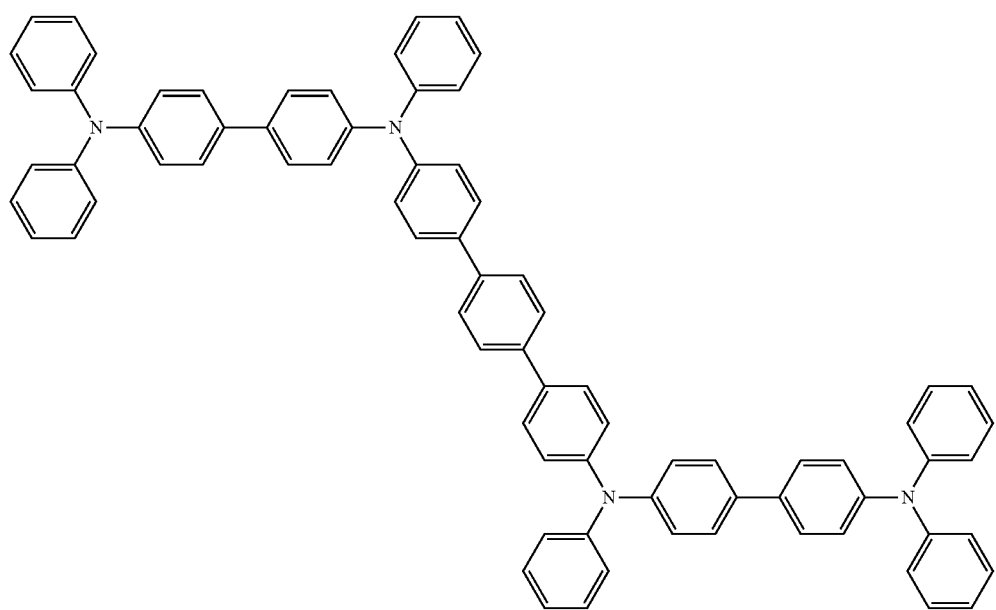
4

-continued
5
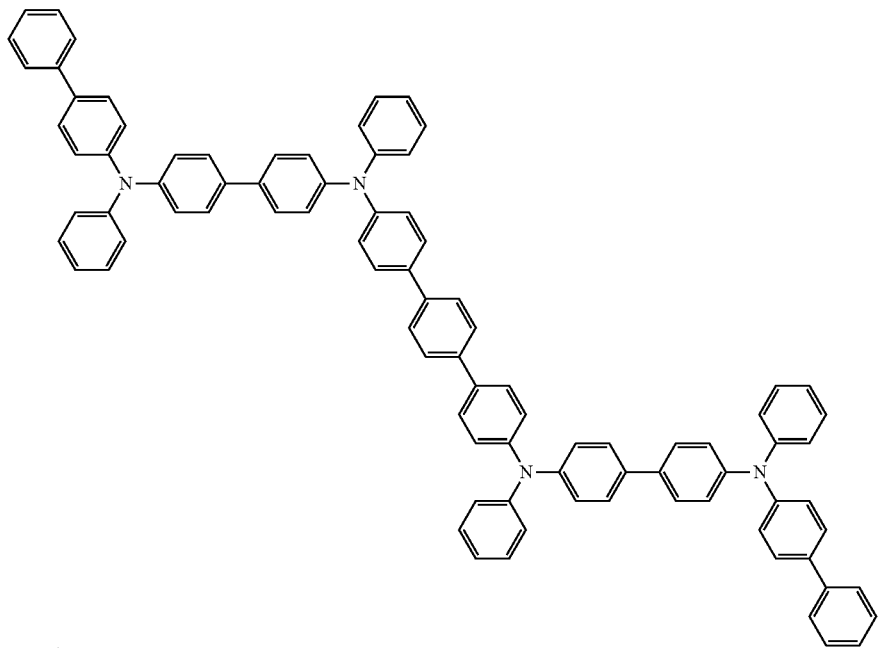
6
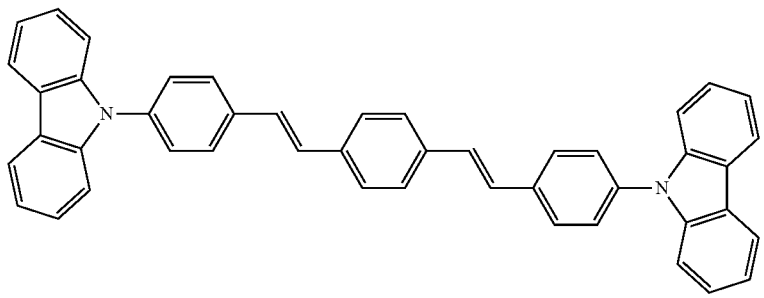
7
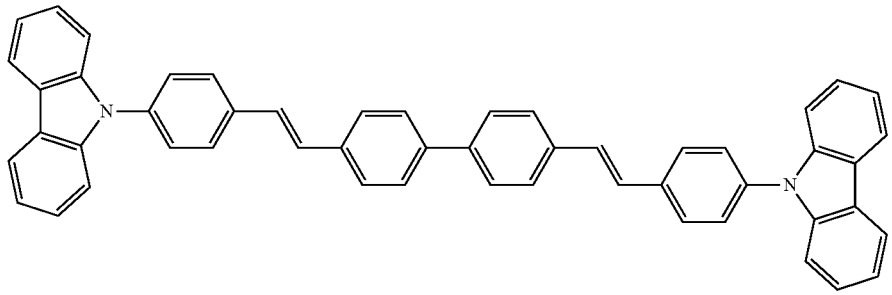
8 9
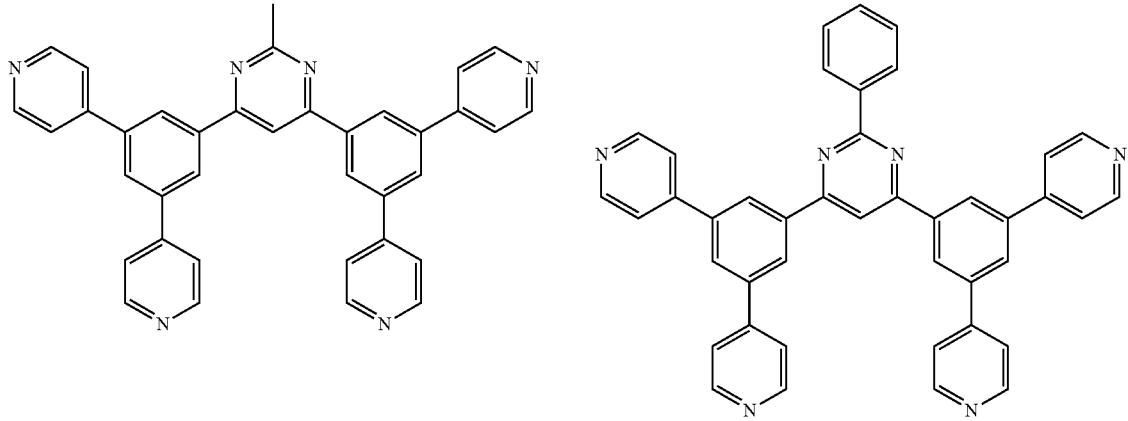

-continued

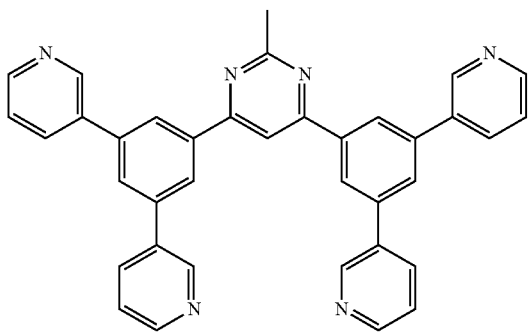

10

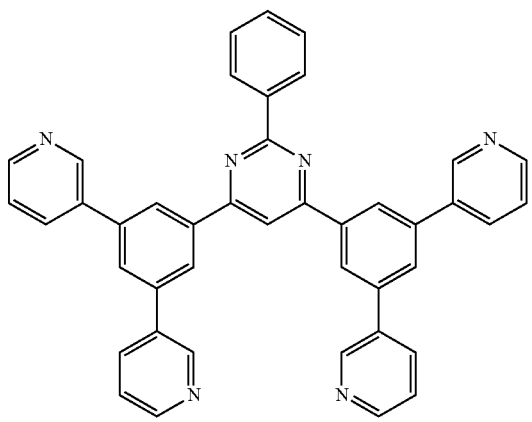

11

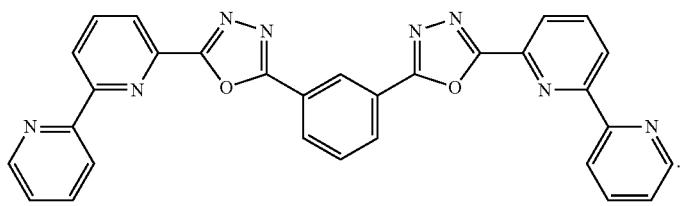

12

7. The organic light-emitting apparatus as claimed in claim 1, wherein the organic light-emitting apparatus further comprises:
an encapsulating layer encapsulating the organic light-emitting device; and
an optical layer on the encapsulating layer,
wherein the anisotropic film is in at least one of the encapsulating layer, the optical layer, and a space between the organic light-emitting device and the encapsulating layer.

8. The organic light-emitting apparatus as claimed in claim 7, wherein the encapsulating layer includes an n number of encapsulating units in which an organic film and an inorganic film are sequentially stacked on the second electrode of the organic light-emitting device, wherein n is an integer of 1 or greater, and
at least one organic film among the n encapsulating units is the anisotropic film.

9. The organic light-emitting apparatus as claimed in claim 8, wherein the inorganic film includes at least one of a metal, a metal nitride, a metal oxide, and a metal oxynitride.

10. The organic light-emitting apparatus as claimed in claim 8, wherein the encapsulating layer further includes a lower inorganic film disposed between the second electrode and the encapsulating unit.

11. The organic light-emitting apparatus as claimed in claim 7, wherein:
the optical layer includes a phase delay layer and a polarizing layer, and
the phase delay layer includes the anisotropic film.

12. The organic light-emitting apparatus as claimed in claim 11, wherein:
the phase delay layer includes a phase delay plate, and
the anisotropic film is between the encapsulating layer and the phase delay plate.

13. The organic light-emitting apparatus as claimed in claim 7, wherein:

at least one of a capping layer and the protective layer is between the second electrode and the encapsulating layer, and
at least one of the capping layer and the protective layer comprises the anisotropic film.

14. The organic light-emitting apparatus as claimed in claim 1, wherein a difference of visibility regarding black color between the front view and the side view ($\Delta_{60°-10°}$) is 0.05 or less:

Difference of visibility regarding black color
between the front view and the side view
($\Delta_{60°10°}$)=value of visibility regarding black
color at a altitude angle of 60° (visibility
regarding black color of the side view)−value
of visibility regarding black color at a altitude
angle of 10° (visibility regarding black color of
the front view).    <Equation 2>

15. An organic light-emitting apparatus, comprising:
a flexible substrate;
an organic light-emitting device on the flexible substrate, the organic light-emitting device including a first electrode, an emission layer, and a second electrode sequentially disposed on the flexible substrate; and
an encapsulating layer encapsulating the organic light-emitting device, wherein
the encapsulating layer includes a first organic film, a first inorganic film, a second organic film, and a second inorganic film which are sequentially disposed on the organic light-emitting device,
the first organic film and the second organic film are identical to or different from each other,
at least one of the first organic film and the second organic film is an anisotropic film including an anisotropic material horizontally oriented with respect to a surface of the flexible substrate, an orientation order parameter of the anisotropic material being about −0.5 to about −0.2, and
the anisotropic material includes a compound represented by any one of Formulae 1 to 3 below:

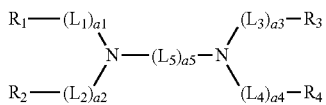

<Formula 1>

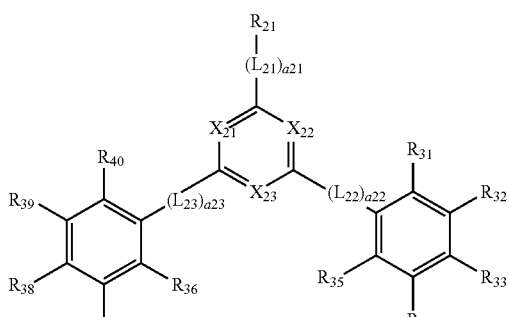

<Formula 2>

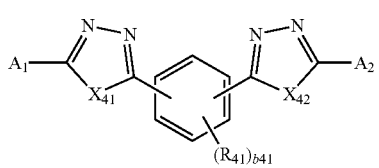

<Formula 3>

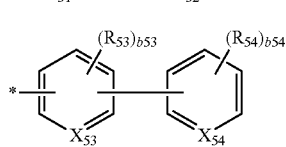

<Formula 4>

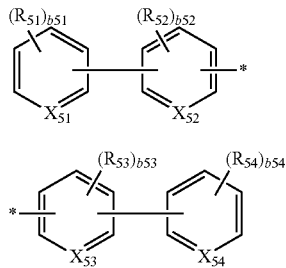

<Formula 5> wherein, in Formulae 1 to 3, $L_1$ to $L_5$ and $L_{21}$ to $L_{23}$ are each independently one of a substituted or unsubstituted $C_2$-$C_{10}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a4 are each independently 0, 1, 2, or 3, wherein, when a1 is 2 or greater, two or more $L_1$ are identical to or different from each other, when a2 is 2 or greater, two or more $L_2$ are identical to or different from each other, when a3 is 2 or greater, two or more $L_3$ are identical to or different from each other, and, when a4 is 2 or greater, two or more $L_4$ are identical to or different from each other;

a1+a2+a3+a4 is 1 or greater;

a5 is 2, 3, 4, 5, 6, or 7, wherein, when a5 is 2 or greater, two or more $L_5$ are identical to or different from each other;

a21 to a23 are each independently 0, 1, or 2, wherein, when a21 is 2 or greater, two or more $L_{21}$ are identical to or different from each other, when a22 is 2 or greater, two or more $L_{22}$ are identical to or different from each other, and, when a23 is 2 or greater, two or more $L_{23}$ are identical to or different from each other;

$X_{21}$ is N or $C(R_{61})$, $X_{22}$ is N or $C(R_{62})$, and $X_{23}$ is N or $C(R_{63})$;

$X_{41}$ and $X_{42}$ are each independently O or S;

$A_1$ is represented by Formula 4, $A_2$ is represented by Formula 5, $X_{51}$ is $C(R_{71})$ or N, $X_{52}$ is $C(R_{72})$ or N, $X_{53}$ is $C(R_{73})$ or N, $X_{54}$ is $C(R_{74})$ or N, at least one of $X_{51}$ and $X_{52}$ is N, and at least one of $X_{53}$ and $X_{54}$ is N;

$R_1$ to $R_4$ and $R_{31}$ to $R_{40}$ are each independently one of a hydrogen, $N(R_{11})(R_{12})$, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, each of $R_1$, $R_2$, $R_3$, and $R_4$ is a ring-forming substituent, and $R_1$, $R_2$, $R_3$, and $R_4$ are connectable to each other to form a ring;

$R_{11}$, $R_{12}$, $R_{21}$, $R_{41}$, $R_{51}$ to $R_{54}$, $R_{61}$ to $R_{63}$, and $R_{71}$ to $R_{73}$ are each independently one of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_4$)($Q_5$), and $N(Q_6)(Q_7)$, b41 is 0, 1, 2, 3, or 4 and when b41 is 2 or greater, two or more $R_{41}$ are identical to or different from each other;

b51 and b54 are each independently 0, 1, 2, 3, or 4, wherein, when b51 is 2 or greater, two or more $R_{51}$ are identical to or different from each other and are connectable to each other to form a ring, and, when b52 is 2 or greater, two or more $R_{52}$ are identical to or different from each other and are connectable to each other to form a ring;

b52 and b53 are each independently 0, 1, 2, or 3, wherein, when b52 is 2 or greater, two or more $R_{52}$ are identical to or different from each other and are connectable to each other to form a ring, and, when b53 is 2 or greater, two or more $R_{53}$ are identical to or different from each other and are connectable to each other to form a ring;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group is one of:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group(arylthio), a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$B(Q_{24})(Q_{25})$ and —$N(Q_{26})(Q_{27})$; and —$Si(Q_{31})(Q_{32})(Q_{33})$, —$B(Q_{34})(Q_{35})$, and —$N(Q_{36})(Q_{37})$;

wherein $Q_{11}$ to $Q_{17}$, $Q_{21}$ to $Q_{27}$ and $Q_{31}$ to $Q_{37}$ are each independently one of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

16. The organic light-emitting apparatus as claimed in claim 15, wherein the inorganic film includes at least one of a metal, a metal nitride, a metal oxide, and a metal oxynitride.

17. The organic light-emitting apparatus as claimed in claim 15, wherein the encapsulating layer further includes a lower inorganic film disposed between the second electrode of the organic light-emitting device and the first organic film.

18. An organic light-emitting apparatus, comprising:
a flexible substrate;
an organic light-emitting device on the flexible substrate, the organic light-emitting device including a first electrode, an emission layer, and a second electrode sequentially on the flexible substrate; and
an encapsulating layer encapsulating the organic light-emitting device;
an optical layer on the encapsulating layer,
wherein:
the optical layer includes a phase delay layer including a phase delay plate and a polarizing layer,
an anisotropic film is between the encapsulating layer and the phase delay plate, the anisotropic film including an anisotropic material horizontally oriented with respect to a surface of the flexible substrate, an orientation order parameter of the anisotropic material being about −0.5 to about −0.2, and
the anisotropic material includes a compound represented by any one of Formulae 1 to 3 below:

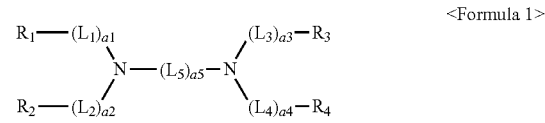

<Formula 1>

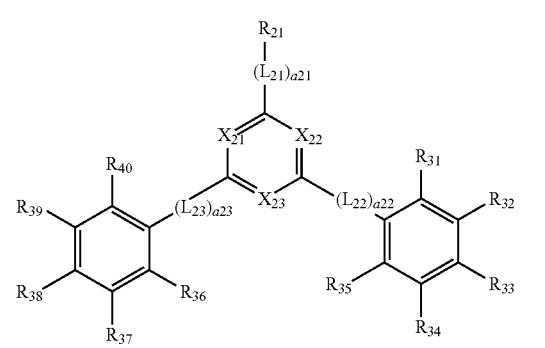

<Formula 2>

-continued

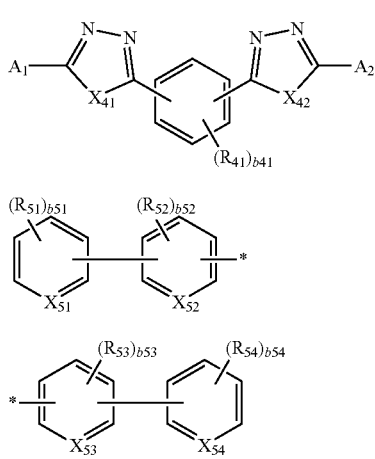

<Formula 3>

<Formula 4>

<Formula 5> wherein, in Formulae 1 to 3, $L_1$ to $L_5$ and $L_{21}$ to $L_{23}$ are each independently one of a substituted or unsubstituted $C_2$-$C_{10}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a4 are each independently 0, 1, 2, or 3, wherein, when a1 is 2 or greater, two or more $L_1$ are identical to or different from each other, when a2 is 2 or greater, two or more $L_2$ are identical to or different from each other, when a3 is 2 or greater, two or more $L_3$ are identical to or different from each other, and, when a4 is 2 or greater, two or more $L_4$ are identical to or different from each other;

a1+a2+a3+a4 is 1 or greater;

a5 is 2, 3, 4, 5, 6, or 7, wherein, when a5 is 2 or greater, two or more $L_5$ are identical to or different from each other;

a21 to a23 are each independently 0, 1, or 2, wherein, when a21 is 2 or greater, two or more $L_{21}$ are identical to or different from each other, when a22 is 2 or greater, two or more $L_{22}$ are identical to or different from each other, and, when a23 is 2 or greater, two or more $L_{23}$ are identical to or different from each other;

$X_{21}$ is N or $C(R_{61})$, $X_{22}$ is N or $C(R_{62})$, and $X_{23}$ is N or $C(R_{63})$;

$X_{41}$ and $X_{42}$ are each independently O or S;

$A_1$ is represented by Formula 4, $A_2$ is represented by Formula 5, $X_{51}$ is $C(R_{71})$ or N, $X_{52}$ is $C(R_{72})$ or N, $X_{53}$ is $C(R_{73})$ or N, $X_{54}$ is $C(R_{74})$ or N, at least one of $X_{51}$ and $X_{52}$ is N, and at least one of $X_{53}$ and $X_{54}$ is N;

$R_1$ to $R_4$ and $R_{31}$ to $R_{40}$ are each independently one of a hydrogen, $N(R_{11})(R_{12})$, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, each of $R_1$, $R_2$, $R_3$, and $R_4$ is a ring-forming substituent, and $R_1$, $R_2$, $R_3$, and $R_4$ are connectable to each other to form a ring;

$R_{11}$, $R_{12}$, $R_{21}$, $R_{41}$, $R_{51}$ to $R_{54}$, $R_{61}$ to $R_{63}$, and $R_{71}$ to $R_{73}$ are each independently one of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_7$-$C_{60}$ alkenyl group, a substituted or unsubstituted $C_2$-$C_{60}$ alkenyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —B$(Q_4)(Q_5)$, and N$(Q_6)(Q_7)$, b41 is 0, 1, 2, 3, or 4 and when b41 is 2 or greater, two or more $R_{41}$ are identical to or different from each other;

b51 and b54 are each independently 0, 1, 2, 3, or 4, wherein, when b51 is 2 or greater, two or more $R_{51}$ are identical to or different from each other and are connectable to each other to form a ring, and, when b52 is 2 or greater, two or more $R_{52}$ are identical to or different from each other and are connectable to each other to form a ring;

b52 and b53 are each independently 0, 1, 2, or 3, wherein, when b52 is 2 or greater, two or more $R_{52}$ are identical to or different from each other and are connectable to each other to form a ring, and, when b53 is 2 or greater, two or more $R_{53}$ are identical to or different from each other and are connectable to each other to form a ring;

at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group is one of:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group(arylthio), a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —B($Q_{14}$)($Q_{15}$), and —N($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —B($Q_{24}$)($Q_{25}$) and —N($Q_{26}$)($Q_{27}$); and —Si($Q_{31}$)($Q_{32}$)($Q_{33}$), —B($Q_{34}$)($Q_{35}$) and —N($Q_{36}$)($Q_{37}$);

wherein $Q_{11}$ to $Q_{17}$, $Q_{21}$ to $Q_{27}$ and $Q_{31}$ to $Q_{37}$ are each independently one of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

\* \* \* \* \*